(12) United States Patent
Luconi

(10) Patent No.: US 7,156,088 B2
(45) Date of Patent: Jan. 2, 2007

(54) SOLAR COLLECTOR MOUNTING ARRAY

(75) Inventor: Gregg Frederick Luconi, Pasadena, CA (US)

(73) Assignee: Energy Innovations, Inc., Pasadena, CA (US)

( * ) Notice: Subject to any disclaimer, the term of this patent is extended or adjusted under 35 U.S.C. 154(b) by 0 days.

(21) Appl. No.: 11/144,995

(22) Filed: Jun. 2, 2005

(65) Prior Publication Data

US 2005/0217665 A1 Oct. 6, 2005

Related U.S. Application Data

(63) Continuation-in-part of application No. 11/042,031, filed on Jan. 24, 2005.

(60) Provisional application No. 60/612,592, filed on Sep. 22, 2004, provisional application No. 60/576,770, filed on Jun. 2, 2004, provisional application No. 60/557,738, filed on Mar. 30, 2004.

(51) Int. Cl.
*F24J 2/52* (2006.01)

(52) U.S. Cl. .................. 126/696; 126/684; 248/166

(58) Field of Classification Search ............... 126/696, 126/684, 623, 906, 600, 570, 627; 248/205.1, 248/122.1, 123.11, 125.8, 188.6, 188.7, 166; 52/173.3; 136/244
See application file for complete search history.

(56) References Cited

U.S. PATENT DOCUMENTS

| | | | | |
|---|---|---|---|---|
| 2,247,830 A | * | 7/1941 | Abbot | 126/603 |
| 2,625,930 A | | 1/1953 | Harris | |
| 4,036,462 A | * | 7/1977 | Sheftel | 248/166 |
| 4,071,017 A | | 1/1978 | Russell, Jr. et al. | |
| 4,088,120 A | | 5/1978 | Anderson | |
| 4,102,326 A | | 7/1978 | Sommer | |
| 4,149,523 A | | 4/1979 | Boy-Marcotte et al. | |
| 4,204,214 A | * | 5/1980 | Fassnacht | 343/766 |
| 4,243,018 A | | 1/1981 | Hubbard | |
| 4,249,511 A | * | 2/1981 | Krisst et al. | 126/608 |
| 4,307,709 A | | 12/1981 | Sletten et al. | |
| 4,309,984 A | | 1/1982 | Dorbeck | |
| 4,413,618 A | | 11/1983 | Pitts et al. | |
| 4,510,385 A | * | 4/1985 | Welman | 126/696 |
| 4,587,951 A | | 5/1986 | Townsend et al. | |

(Continued)

FOREIGN PATENT DOCUMENTS

FR 2 497 329 A1 * 7/1982

OTHER PUBLICATIONS

Endecon Engineering, Inc. Making Renewables part of an Affordable and Diverse Electric System in California. Initial Characterization Report for 2nd System: R.W.E. Schott Solar Sunroof FS 20kW PV System[online], May 2004 [retrieved on Feb. 28, 2005]. Retrieved from the Internet; <URL:http://www.pierminigrid.org/FinalDeliverables/Project32/Task3.2. 2a(4)_CharacterizationReport2ndSystem.pdf>.

(Continued)

*Primary Examiner*—Josiah C. Cocks
(74) *Attorney, Agent, or Firm*—Michael Blaine Brooks, P.C.; Andrew S. Nagelstad

(57) ABSTRACT

A solar collector structural support system that affixes to a mounting surface without penetrating the mounting surface is disclosed. The invention in the preferred embodiment includes a junction element adapted to receive: a plurality of leg members; at least one footing adapted to engage frictionally a mounting surface; and a structural support member; wherein a first junction element of the plurality of junction elements receives: a proximal end of a first leg member and a first structural support member. In addition, the junction element may be adapted to receive a ballast element and the ballast element may be adapted to engage a leg member.

15 Claims, 22 Drawing Sheets

U.S. PATENT DOCUMENTS

| | | | |
|---|---|---|---|
| 4,602,613 A | | 7/1986 | Barr |
| 4,999,059 A | * | 3/1991 | Bagno ................... 126/696 |
| 5,161,768 A | * | 11/1992 | Sarabin ................ 248/188.6 |
| 5,507,275 A | * | 4/1996 | Clark ..................... 126/627 |
| 5,564,411 A | | 10/1996 | Myles, III et al. |
| 6,061,978 A | | 5/2000 | Dinwoodie et al. |
| 6,067,982 A | * | 5/2000 | Harrison ................. 126/696 |
| 6,148,570 A | | 11/2000 | Dinwoodie et al. |
| 6,495,750 B1 | | 12/2002 | Dinwoodie |
| 6,501,013 B1 | | 12/2002 | Dinwoodie |
| 6,570,084 B1 | | 5/2003 | Dinwoodie |
| 2003/0010372 A1 | | 1/2003 | Dinwoodie |
| 2003/0010374 A1 | | 1/2003 | Dinwoodie |
| 2003/0164187 A1 | | 9/2003 | Dinwoodie |

OTHER PUBLICATIONS

Vacuum Solar Collectors. Datasheet [online].Watt Systemy Solame. [retrieved on May 2, 2005]. Retrieved from the Internet:<URL:http://www.koleklory.pl/index.php?action=oferta&show=2.1.3&lang=en>.

DayStar Signature Systems. Datasheet [online]. Cascade Sun Works, Inc.[retrieved on Jul. 5, 2005]. Retrieved from the Internet:<URL:http:www.sun-works.com/products/Thermal/solar_hotwater.html>.

Cascade Sun Works Current Projects Bend, Oregon. Datasheet [online].Cascade Sun Works. [retrieved on Jul. 5, 2005]. Retrieved from the Internet: <URL:http:www.sun-works.com/current_projects/2E0901/2E0901.html>.

* cited by examiner

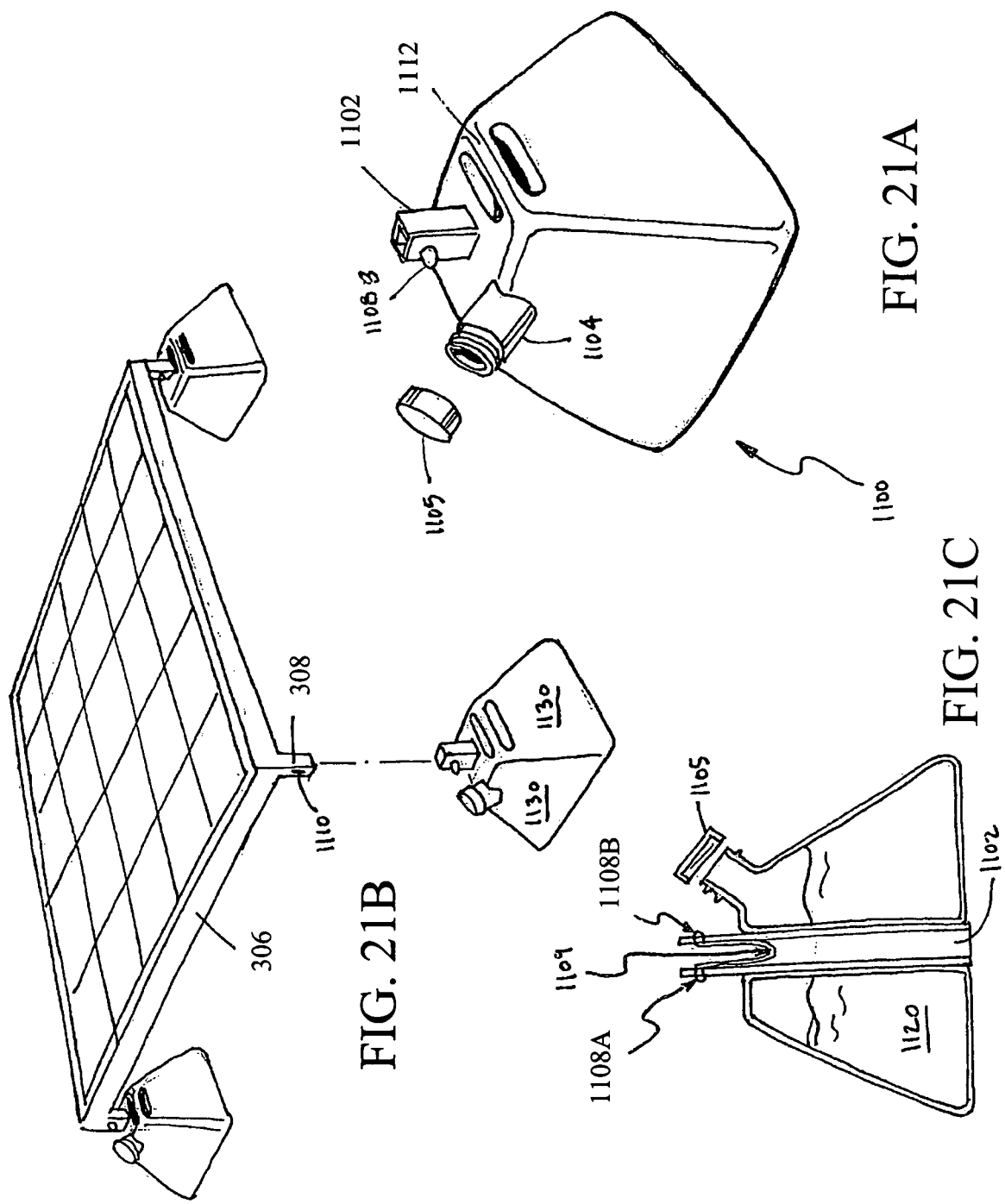

SOLAR COLLECTOR MOUNTING ARRAY

CROSS-REFERENCE TO RELATED APPLICATION

This application claims the benefit of U.S. Provisional Patent Application Ser. No. 60/576,770 filed Jun. 2, 2004, entitled "ROOFTOP CONCENTRATOR," which is hereby incorporated herein for all purposes and this application is a continuation-in-part of Non-provisional patent application Ser. No. 11/042,031 filed Jan. 24, 2005 entitled "SELF-BALASTING SOLAR COLLECTOR" which claims the benefit of U.S. Provisional Patent Application Ser. No. 60/612,592 filed Sep. 22, 2004, entitled "APPARATUS FOR REDIRECTING PARALLEL RAYS USING SIMPLE RIGID TRANSLATION," of U.S. Non-provisional patent application Ser. No. 11/058,023 filed Feb. 14, 2005, entitled "APPARATUS FOR REDIRECTING PARALLEL RAYS USING RIGID TRANSLATION," and of U.S. Provisional Patent Application Ser. No. 60/557,738 filed Mar. 30, 2004, entitled NON-PENETRATING ROOF-MOUNTED TRACKING SOLAR COLLECTOR," both of which are hereby incorporated by reference herein for all purposes.

FIELD OF INVENTION

The invention generally relates to solar collector support structures and particularly relates to a system of solar collector support structures frictionally (can be affixed with adhesive if need be) affixed to a mounting surface via one or more non-penetrating contacts.

BACKGROUND

Solar collectors by their nature are, at some time in their operation, exposed to the outdoor environment. In some systems, the wind load may produce lateral forces that push the system in a direction co-parallel to the wind as well lifting forces that can pull a system upwardly. As such, a solar collector is subjected to wind forces they may be large enough to cause the solar collector to move with such motion disrupting the operation of the device. In order to maintain its location, the support structure for a solar collector is fixed attached to it mounting surface. If the mounting surface is at ground level, a firm mounting may be achieved by attaching the solar collector support structure to concrete footings that may be placed at or below ground level. If the mounting surface is the top of a building, roof-penetrating mounting anchors may be used to secure the solar collector support structure. With repeated small motions and aging, the mounting anchor's seals loosen and permit water leakage. In addition, depending on the roof-penetrating mounting anchors used, it may be difficult, if not impossible to re-roof or resurface the rooftop with the solar collector support structure anchors present. There is therefore a need for a solar collector support structure adapted to remain fixed on a mounting surface such as roof and, when deployed with one or more solar collectors, sufficiently wind resistant without surface-penetrating anchors.

SUMMARY

The invention in its several embodiments provides one or more support structures for solar collectors, solar concentrators, heliostats and wind blinds or articulated wind blinds as part of a wind management system, that may be mounted on mounting surfaces such as rooftops or ground surfaces where penetration of the mounting surface for anchoring purposes is not permitted. Generally, the system of solar collector support structures frictionally affixed to a mounting surface via one or more non-penetrating contacts. The systems are modular in their preferred embodiments and my additionally laterally supported via abutting with structures extending from the mounting surface or via extending below the mounting surfaces at one or more of its edges. Accordingly, the system of solar collector support structures, when deployed, provides a frame that includes a plurality of footings adapted to frictional affix the frame to a roof, for example, so that one or more solar collecting devices may be detachably secured to the roof without compromising the integrity of the roof.

The solar collector devices may include a directable array or tracking array of optical elements, or a continuous surface typically concentrating sunlight on a receiver may be a photovoltaic cell and the one or more reflectors include an array of mirrors. The concentrator, including the receiver and mirrors, may include a heliostat array. The heliostat array includes: (a) a positioning plate adapted to simultaneously aim each of the plurality of mirrors—each of which is adapted to rotate about a first center of rotation—in a direction bisecting the interior angle between the source and the receiver; and (2) a plurality of reflector positioning arms for operably coupling the plurality of reflectors to the positioning plate, each of the positioning arms being adapted to rotate relative to the positioning plate about a second center of rotation.

The mast of a directable or tracking array and the footings of a heliostat array for example may engage the system of solar collector support structures to exploit the friction between the system's surface contact pads and a rooftop, thereby enabling the solar collecting device to reside on the rooftop without using fasteners or anchors that might otherwise penetrate the mounting surface and, in this example, expose the roof to damage.

BRIEF DESCRIPTION OF THE DRAWINGS

The present invention is illustrated by way of example and not limitation in the figures of the accompanying drawings in which:

FIG. 21A–21B are perspective views of a footing for frictionally affixing the heliostat to a roof, in accordance with a first embodiment of the footing;

FIG. 21C is a cross sectional view of a footing for frictionally affixing the heliostat to a roof, in accordance with the first embodiment of the footing;

DETAILED DESCRIPTION

The invention in its several embodiments and as a system of solar collector support structures provides for the mounting of one or more solar energy collecting devices wherein the mounting may be made secure to a mounting surface such as a rooftop without penetrating the surface. The solar collectors, in some embodiments, include collection surfaces that are broken into smaller elements so that the collection surface does not present a solid surface to the wind, but rather a perforated surface that wind can at least partially blow through. In some embodiments, the collector or reflecting surface is solid. The solar collectors in some embodiments may be heliostat arrays.

The system of solar collector support structures solar collectors optionally receive integral wind deflector to further reduce the magnitude of aerodynamic drag and lift forces generated in high wind conditions on the one or more solar collectors that may be structurally supported by the system. The wind deflector is typically configured to reduce the amount of wind to which adjacent solar collectors may be subjected, and preferable to cause the wind to exert a downward, stabilizing force on the solar collector, rather than an upward, lifting force. The system of solar collector support structures also optionally include leg extensions that can be adjusted to extend to the edges of the roof, to further reduce the likelihood that the solar collectors will slide out of position on the roof. In addition, to further reduce the likelihood that the solar collectors will slide out of position on the roof, the system of solar collector support structures for mounting on a first surface without penetrating the surface may also optionally include leg extensions that are interposed between a leg of the system and a second surface extending from the mounting surface, e.g., a rooftop wall, and optionally placed in compression with a resilient element.

Figure 1:
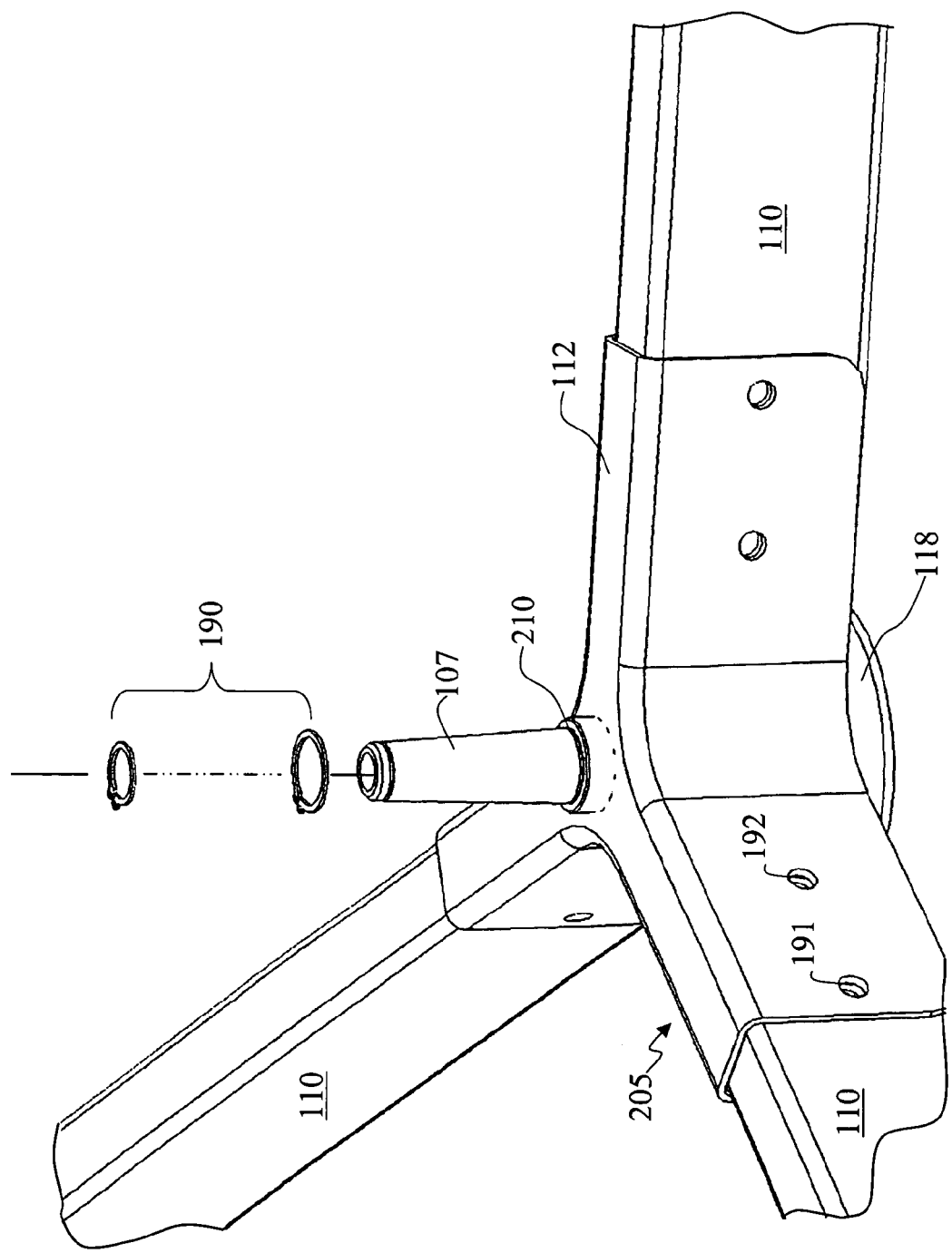
FIG. 1 is a close-up view of a junction element having a support member.

Illustrated by example in FIG. 1 is a junction element 112 that has three arms 205, or leg member receptacles, sockets, braces or mounts, and each arm has a top side and two lateral sides with each lateral side having a proximal aperture and a distal aperture. Accordingly, each arm 205 of a junction element 112 forms a trough for receiving a leg member 110. The proximal aperture 192 preferably receives a fastener, pin or bolt that passes through both lateral sides of the arm and passes through a leg member 110 and preferably allows for rotation of the leg about the fastener. The distal aperture 191 of the each arm preferably receives a removable fastener, pin or bolt that passes through both lateral sides of the arm and passes through the leg member thereby joining the leg member rigidly to the arm of the center junction element 112. The junction element 112 preferably has a top aperture 210 adapted to receive and secure a footing or friction pad fastener. A junction element 112 assembled as a central junction is also preferably adapted to receive at its top aperture a support riser or member that may be secured via a washer and nut assembly 190, for example. For example, the center junction elements 112 may include a support member or post 107 that may be configured to receive a solar collector mast or footing thereon or otherwise provide support for other assemblies and devices. Other embodiments can include snap-fit and screw-type coupling of the support member with a device to be mounted.

Figure 2:
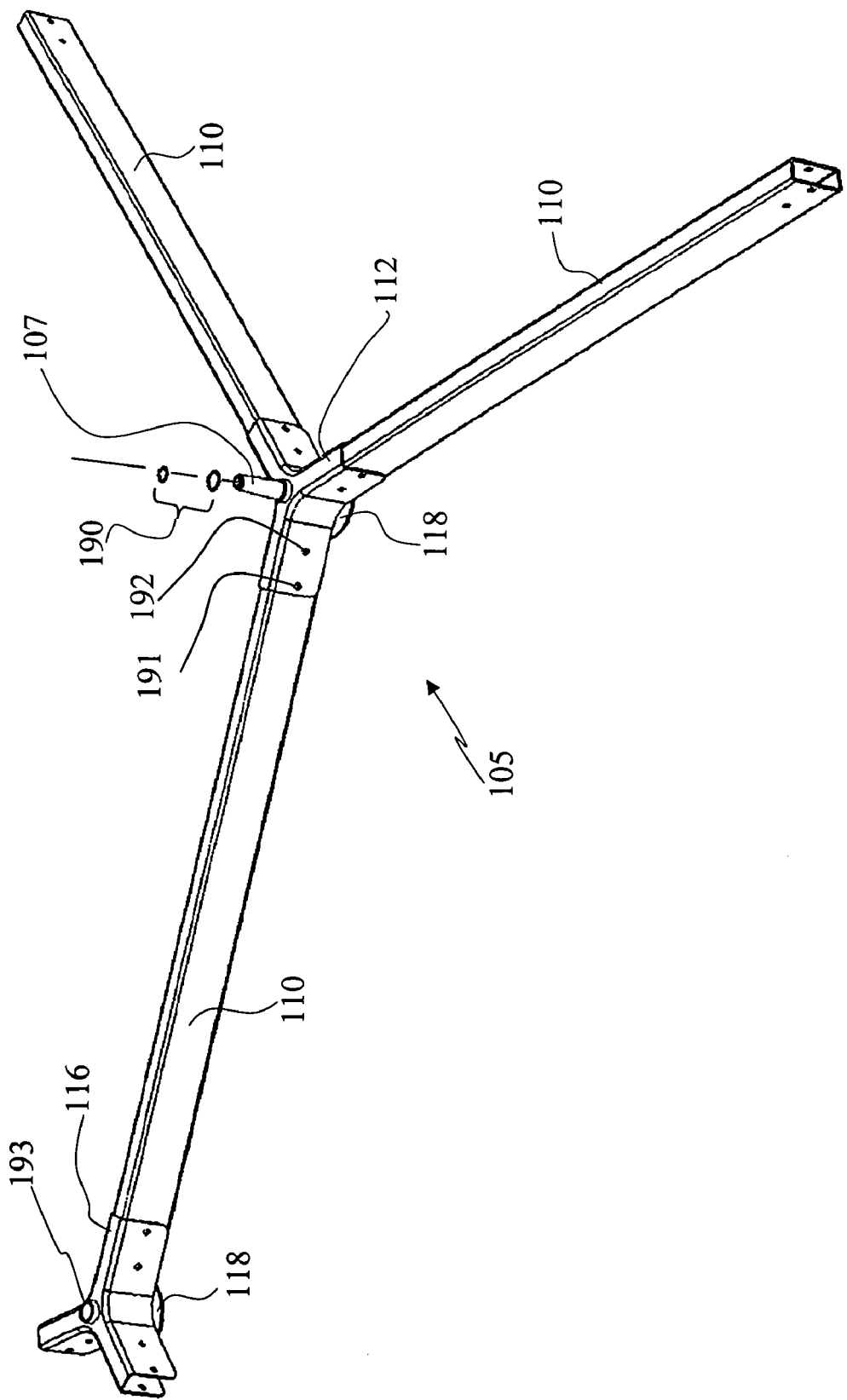
FIG. 2 is a perspective view of an exemplary deployed base assembly of the present invention.
Figure 3:
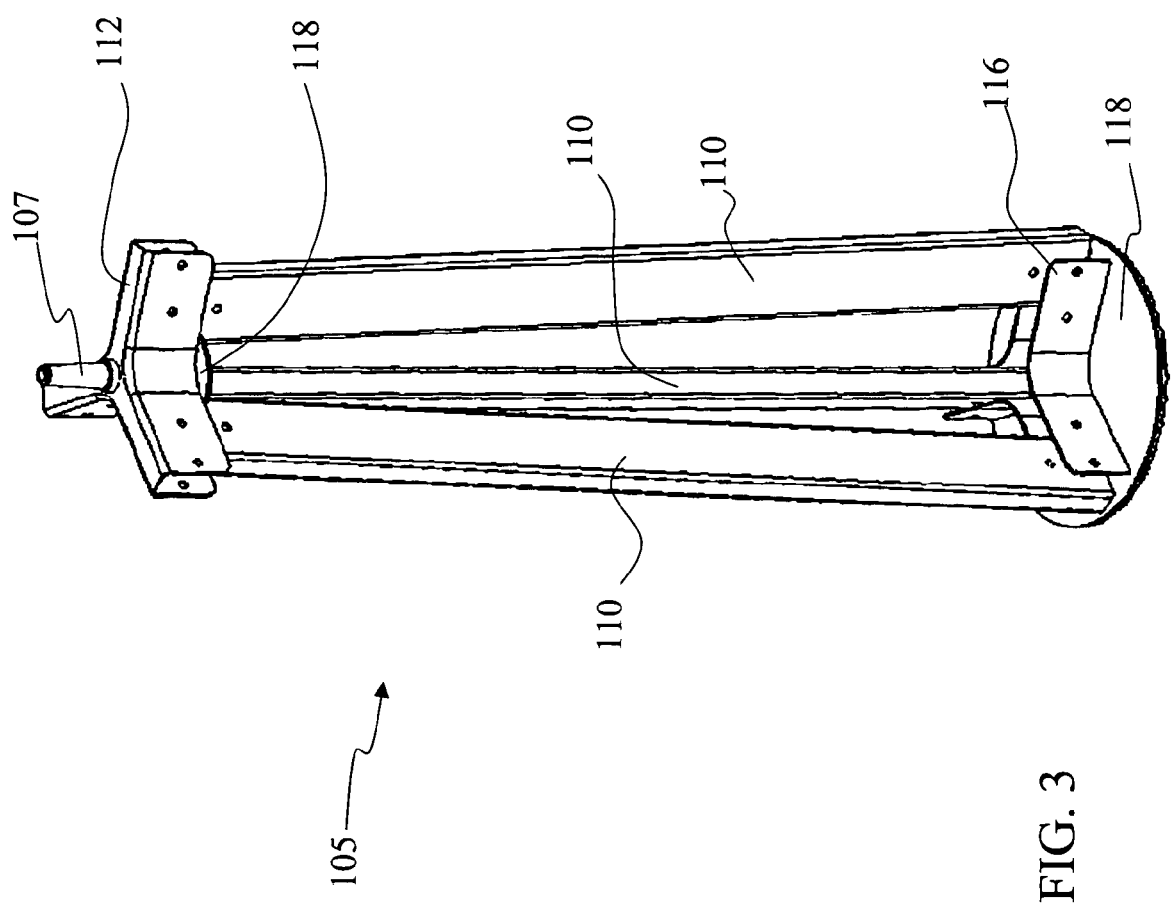
FIG. 3 is a perspective view of an exemplary base assembly of the present invention in a stow configuration.

FIG. 2 is a perspective view of a base assembly 105 of the system of solar collector support structures. A central junction element is preferably rotatably or rigidly joined to three leg members. Preferably the leg members and junction elements are made of light weight materials resistant to environmental effects such as anodized aluminum. Other materials suitable for leg member and junction elements include anodized steel, alloys, composites, and resins. A central junction also preferably adapted to receive at its top aperture a support riser or member that may be secured via a washer and nut assembly. Relative to the central junction element, a peripheral junction element 116 secured to the distal end of a leg member of the base assembly. When only the proximal fasteners of the central junction element and the proximal faster of the peripheral junction element are engaged, the distal ends of the three leg members may rotated about the proximal fasteners to be proximate to one another, preferably co-parallel, and the peripheral junction element may be rotated to receive the distal ends of the leg members of the base assembly. This exemplary stowed position is illustrated by FIG. 3.

Figure 4:
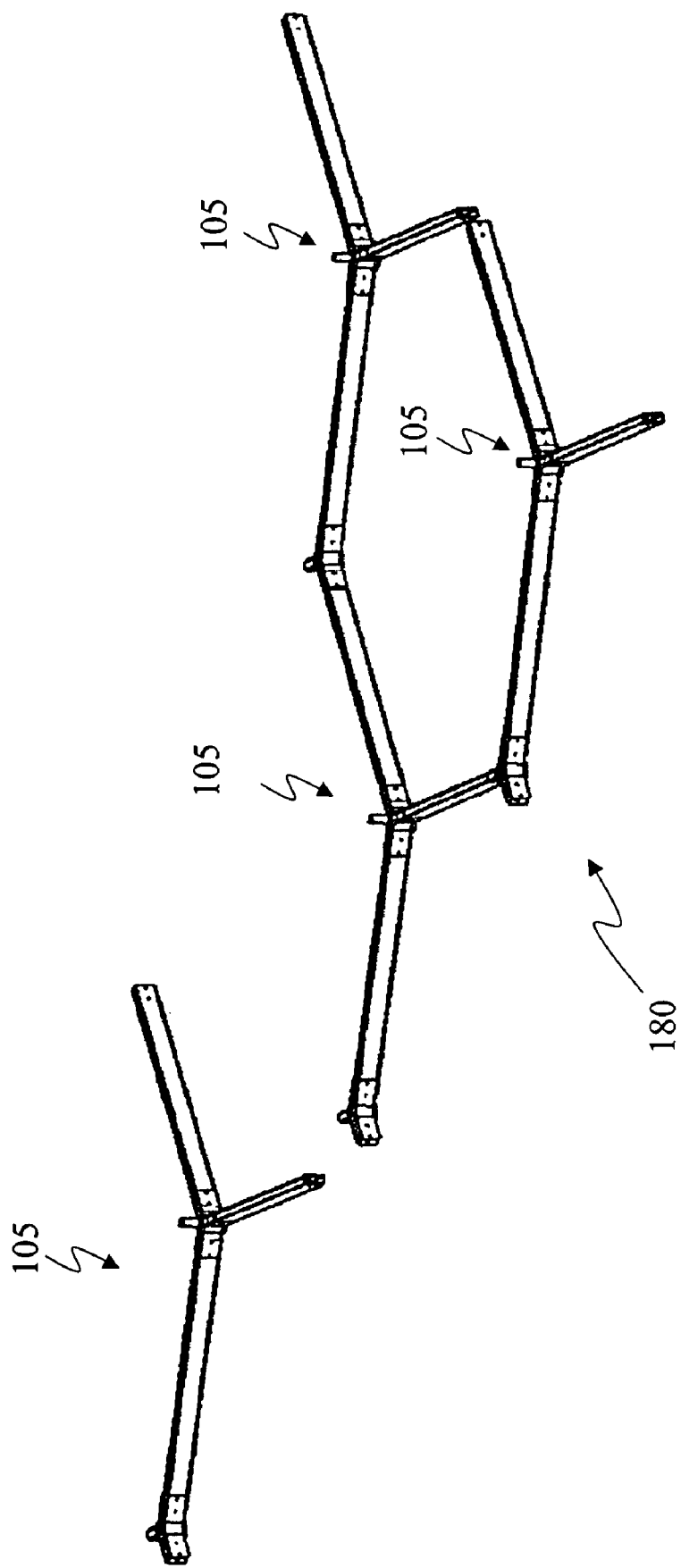
FIG. 4 is a perspective view of a plurality of exemplary base assemblies as an interconnected array.

Returning to the deployed example of FIG. 2, two additional arms of the peripheral junction element are available to receive leg members including leg members of other base assemblies. This allows a plurality of base assemblies 105 to be interconnected, as illustrated in FIG. 4. The base assemblies can be interconnected via the peripheral junction elements 116, which optionally include spring loaded interlocking pins. The peripheral junction elements 116 optionally include foot friction pads 118 configured to support the base assembly 105 on the roof. In the illustrated exemplary embodiment, wherein each base assembly includes three legs 110, interconnection of the base assemblies 105 produces a hexagonal grid 180. Other grid shapes may be made with other embodiments of the multi-armed junction elements, wherein the base assemblies include other numbers of legs. For example, base assemblies having a central junction element with four arms and four legs may be used to create a square grid.

Figure 5:
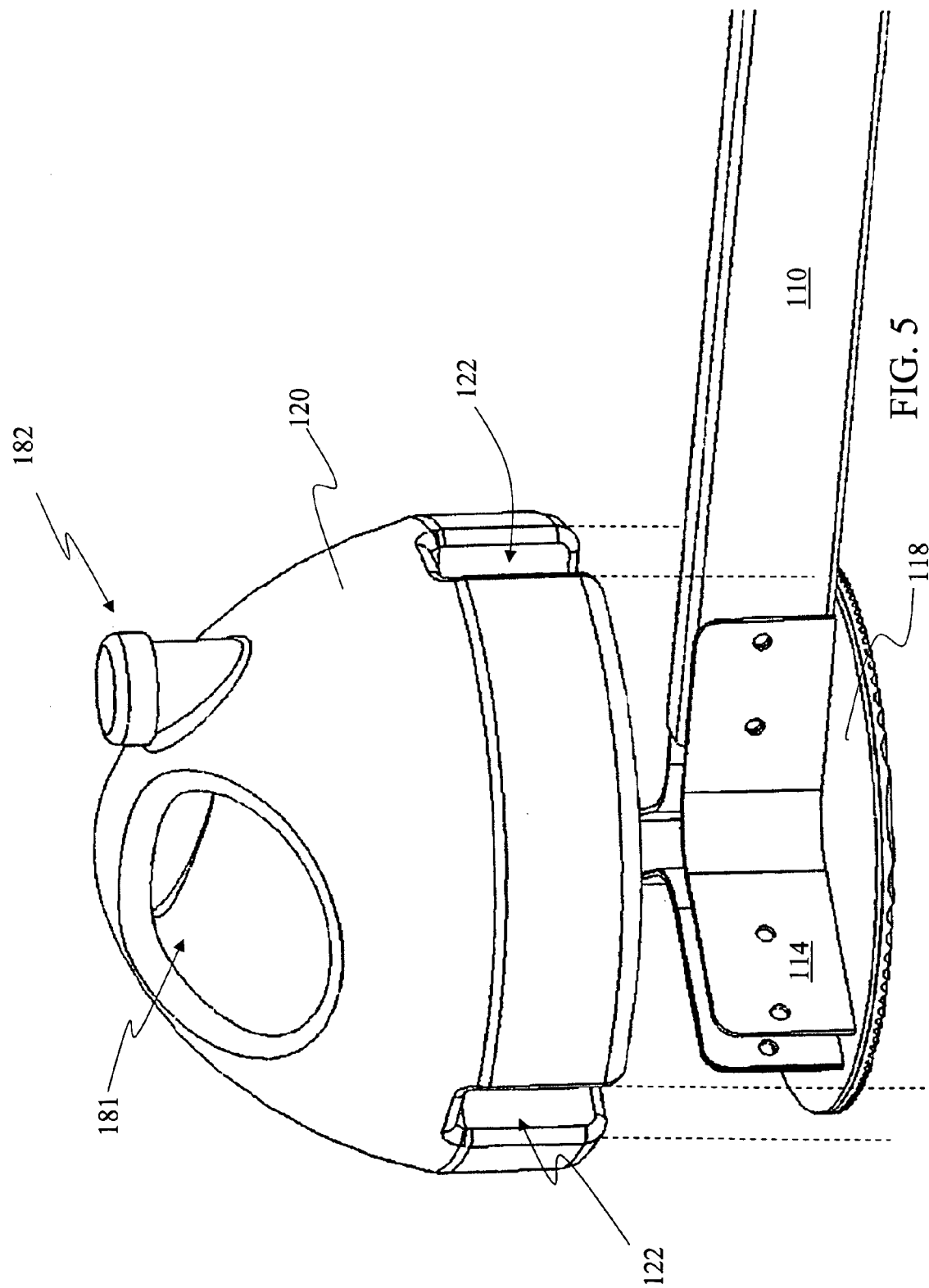
FIG. 5 is a perspective view of the deployment of an exemplary ballast tank over an exemplary peripheral junction element.
Figure 6:
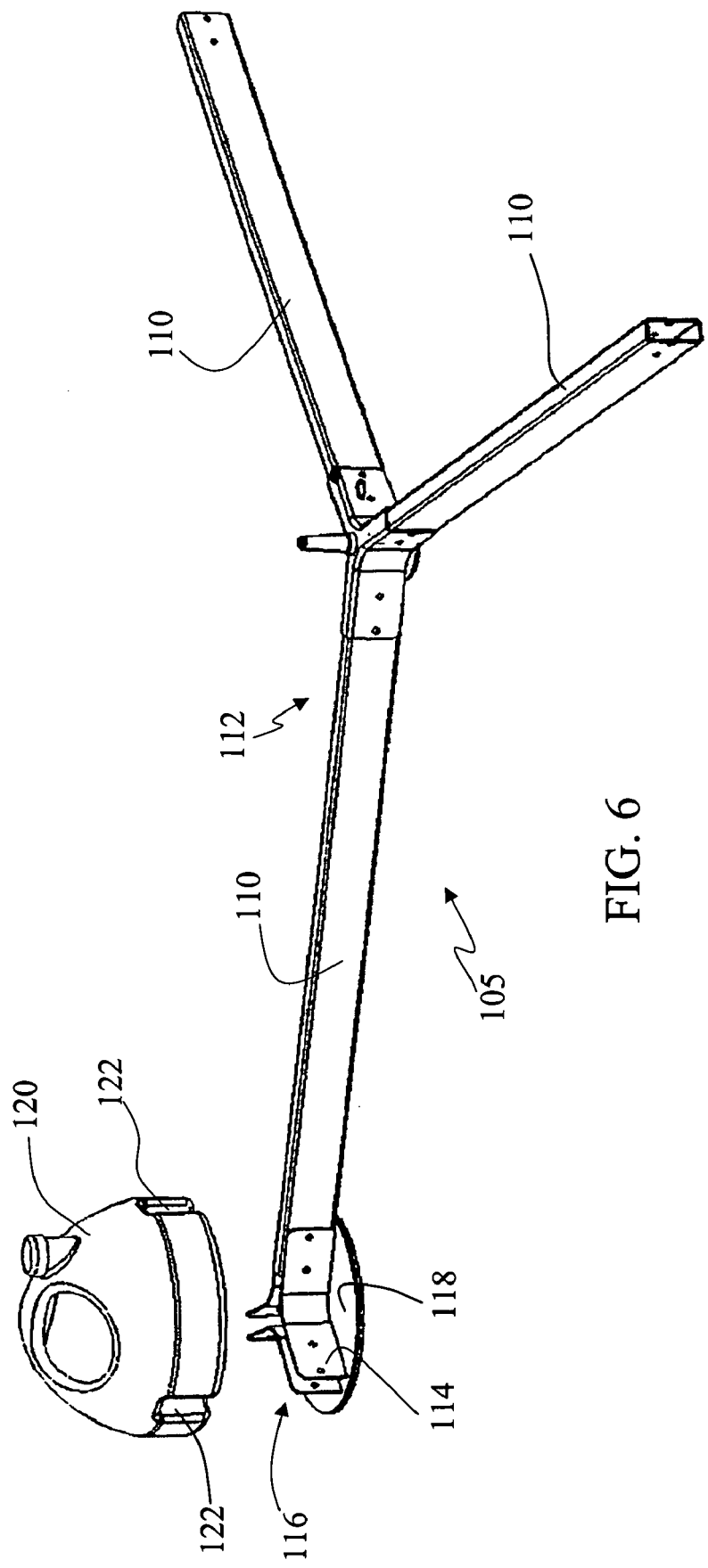
FIG. 6 is a perspective view of an exemplary base assembly, including the ballast tank arrangement of FIG. 5.

FIG. 5 illustrates a base assembly 105, having the top side of its peripheral junction facing toward the mounting surface. A friction pad is shown attached to the peripheral junction. Preferably the friction pad is attached to the peripheral junction by a fastener secured via the top aperture. A ballast tank is shown above the peripheral junction prior to placement onto the peripheral junction. The ballast tank 120 includes troughs or slots 122 adapted to receive a leg member or the arm or leg receptacles of the peripheral junction element allowing the ballast tank to be placed over the arms or leg receptacles 114 in the peripheral junction elements 116. The exemplary ballast tank preferably has an integral handle 181 and a capped orifice 182 to receive ballasting material. The general shape of the ballast tank is hemispherical to minimize wind resistance and while maintaining a ballast material reservoir volume. A ballast tank 120 may be secured to the peripheral junction elements 116 using friction fits, tabs, snaps, or other appropriate attachment mechanisms. In an alternative configuration, a ballast tank 120 can be positioned over the ends of one or more legs, even without a peripheral junction element 116, by positioning the ends of the legs 110 into the slots 122. As described above, the weighted ballast tanks 120 assist in securing the array of base assemblies 105 by weighting the points where legs of adjoining base assemblies meet. The exemplary deployed base assembly 105 of FIG. 6 illustrates ballast tank above and prior to engaging a peripheral junction element. As described above, the ballast tank 120 may be optionally positioned over a distal end of one or more leg members 110.

Figure 7:
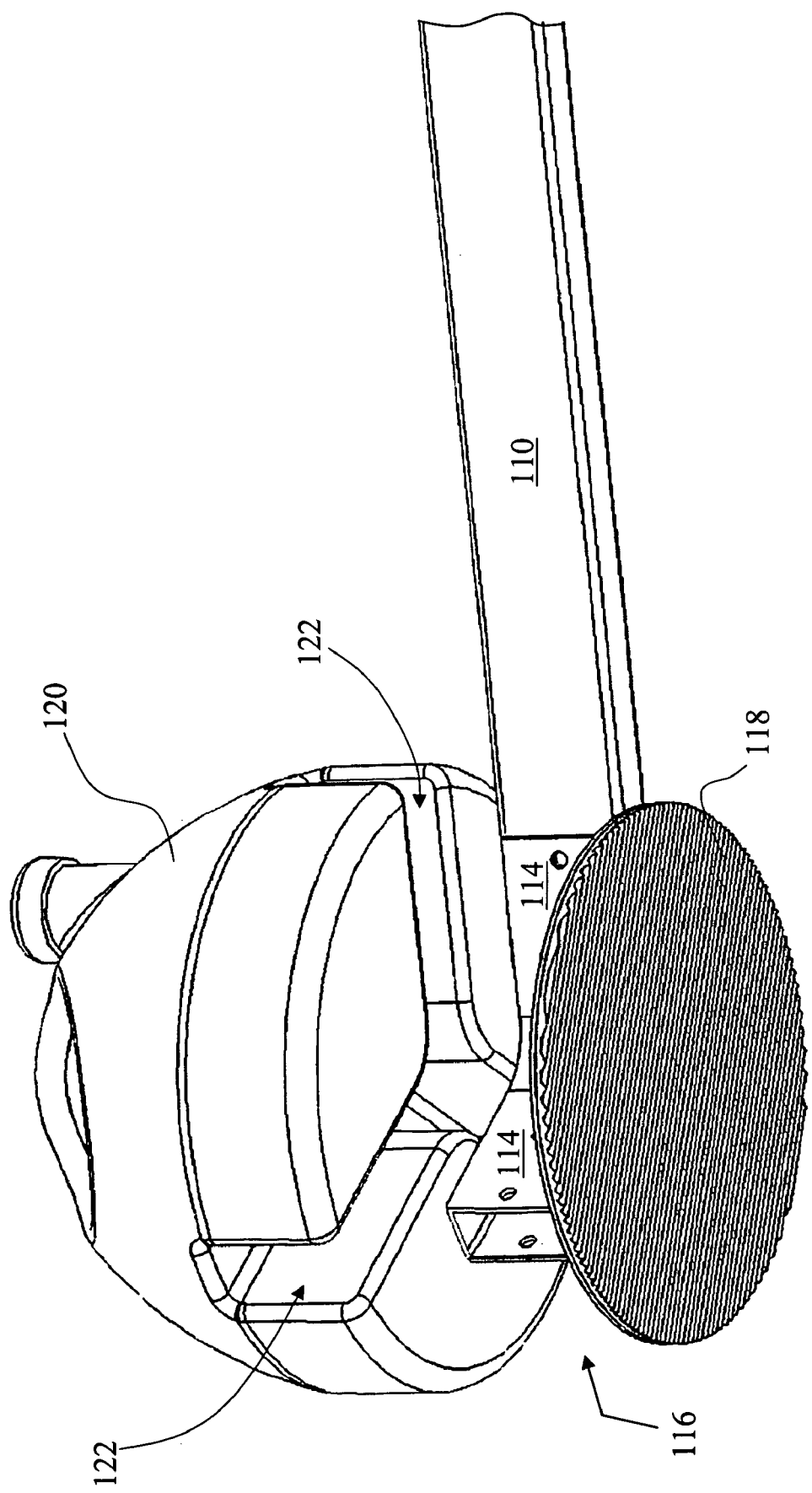
FIG. 7 is a perspective view of an exemplary peripheral junction element including a foot friction pad.
Figure 8:
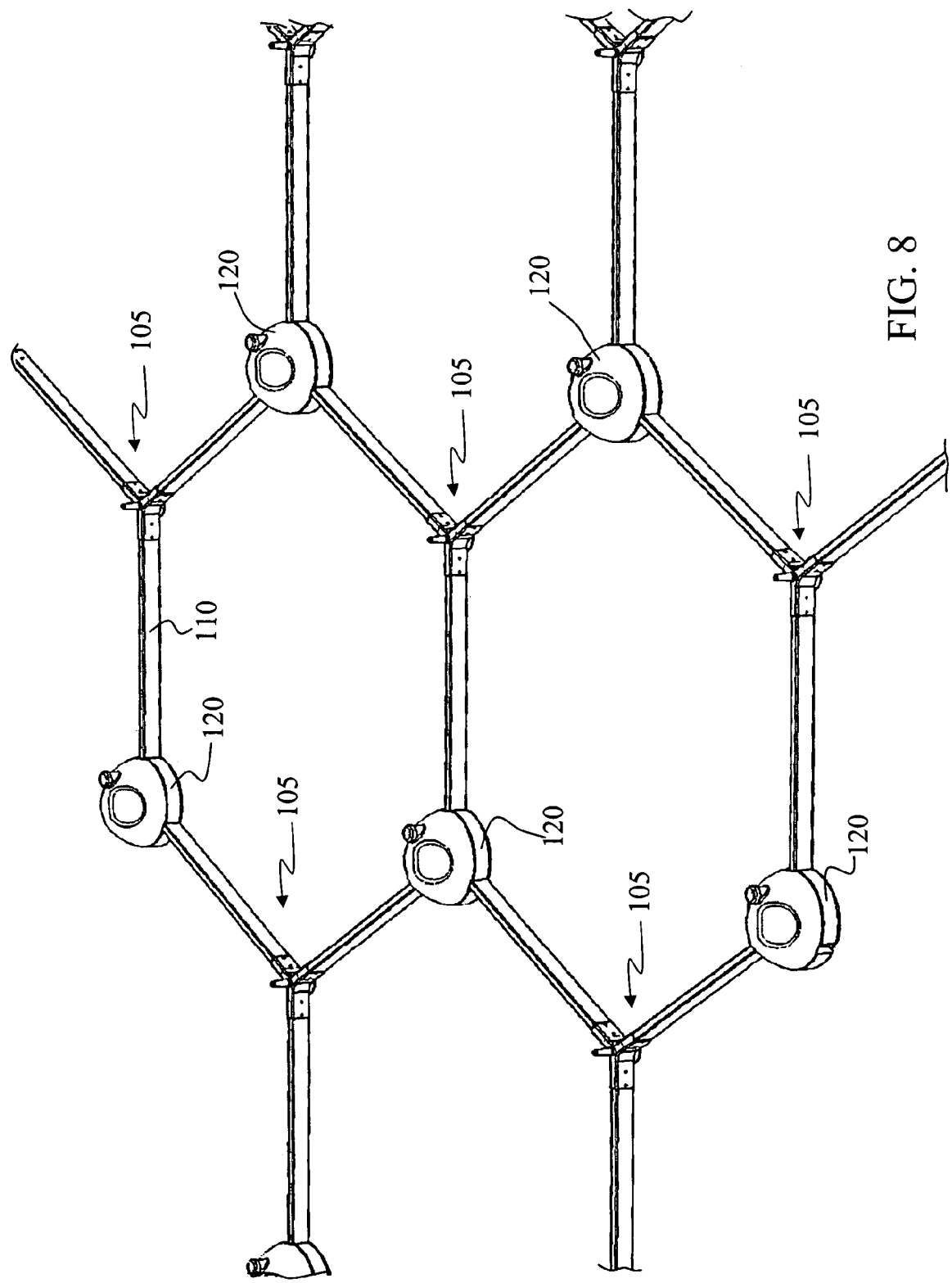
FIG. 8 is a perspective view of the base assemblies of FIG. 4, wherein ballast tanks have been positioned over the peripheral junction elements.

FIG. 7 illustrates a peripheral junction element 116 including foot friction pad 118. In such embodiments, the foot friction pad 118 comprises a material or layers of materials such as molded plastics, neoprene, polyethylene, vinyl, rubber, and anodized steel, and contact surface finishes such a linear ridges or an array of protrusions that cause the pad to be resistant to sliding along the roof, particularly when the weight of the ballast tank 120 is positioned over the peripheral junction element 116. In some embodiment, the foot friction pad 118 is selected for use with particular roof types, such as wood shake roofs and tile roofs. In place of or in addition to a pad, one or more fasteners may be used in some embodiments to secure the system to a mounting surface. The perspective view of the underside of the ballast tank or ballast element illustrates an example of the ballast tank adapted to receive via three troughs or slots a peripheral junction element having three arms. Other embodiments of ballast tanks or elements may have more or less troughs. For example, an alternative embodiment of a ballast tank may have four troughs in a cruciform arrangement to receive a peripheral junction element having four arms. FIG. 8 illustrates the array of exemplary base assemblies 105, where ballast tanks 120 have been positioned over the peripheral junction elements 116.

Figure 9:
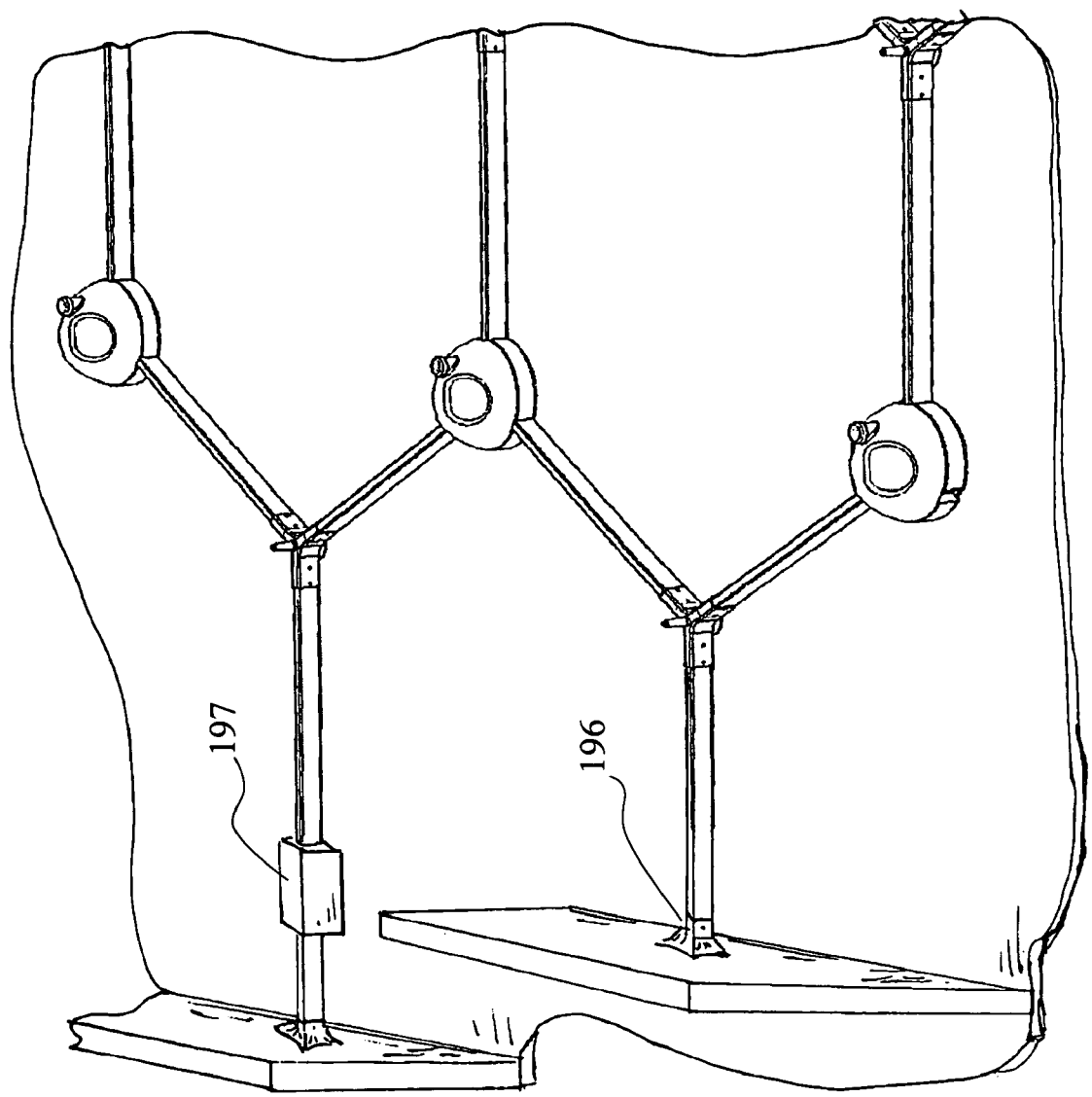
FIG. 9 is a perspective view of the base assemblies of FIG. 8, wherein the array engages exemplary parapets.
Figure 10:
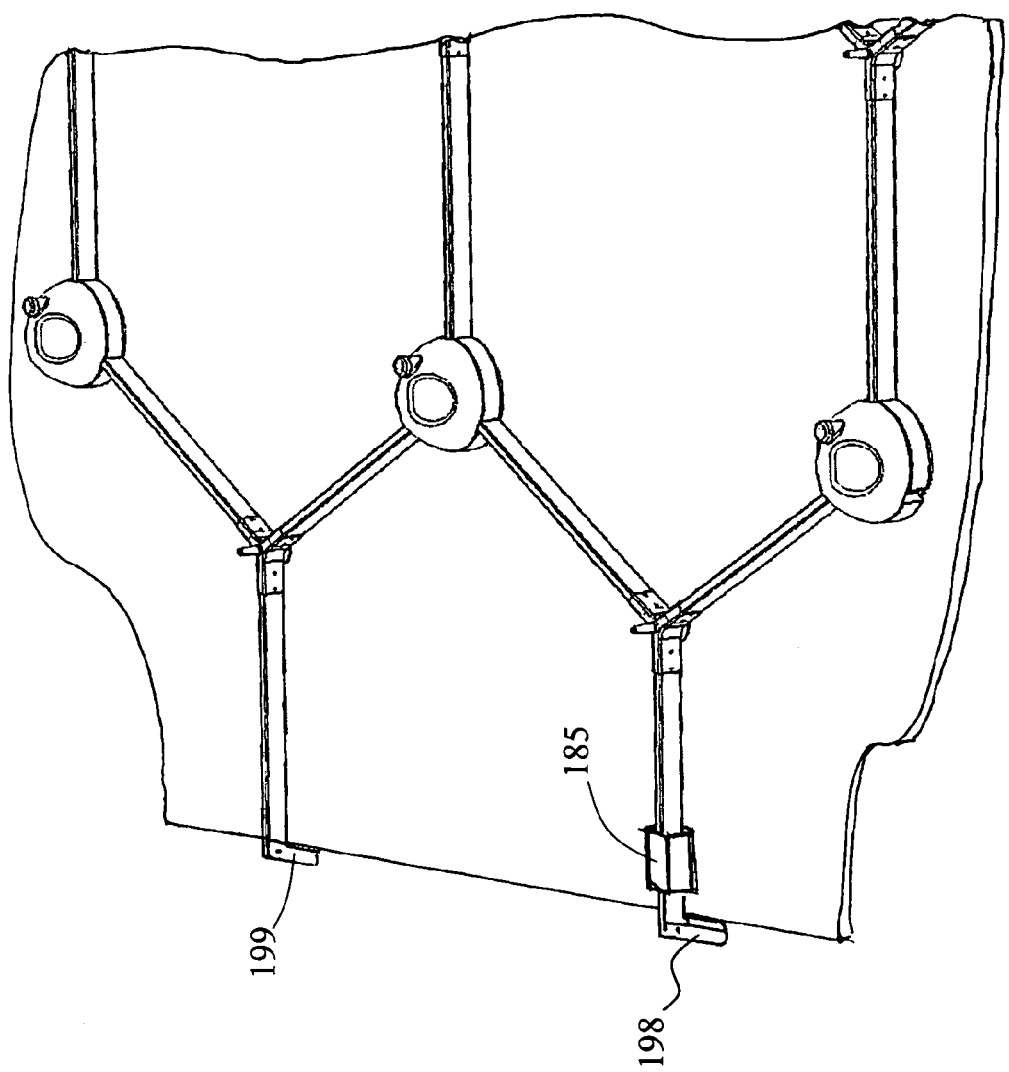
FIG. 10 is a perspective view of the base assemblies of FIG. 8, wherein the array engages a mounting surface edge.

The system of solar collector support structures described herein also optionally includes leg extensions that can be adjusted to extend to the edges of the roof. A schematic configuration of exemplary leg extensions is provided in FIG. 9. As illustrated, when deployed the leg extensions reach to and mount against the edge of the roof, such as against an edge, ledge or parapet. This allows the array of base assemblies to be held in compression, and therefore stabilizes the array of base assemblies and reduces the likelihood of the base assemblies moving or otherwise shifting on the roof. The leg extensions can be extendable to lock into place with a pressure fit 196, such as with a screw tightener, or via an air or coil spring 197. Illustrated in FIG. 10 is an embodiment the system of solar collector support structures for securing to roofs without edges, ledges or parapets, the leg extensions 199 can wrap around the eave of the roof, or hooks or clamps can be coupled to the legs or leg extensions to wrap around the eave or roof edge and may be placed in tension 185.

Figure 11:
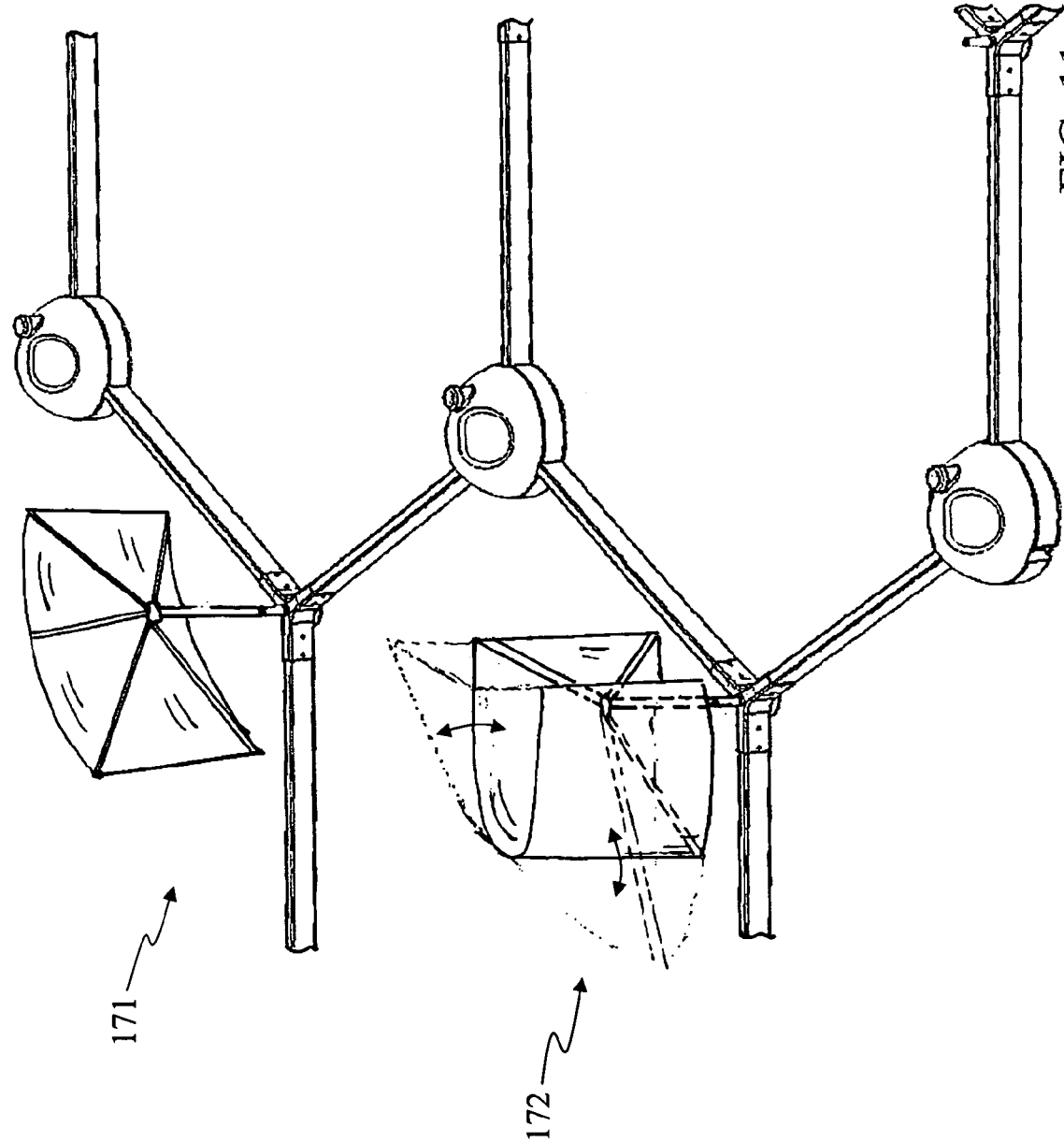
FIG. 11 is a perspective view of the base assemblies of FIG. 8, wherein exemplary wind shield are mounted to the array.
Figure 12:
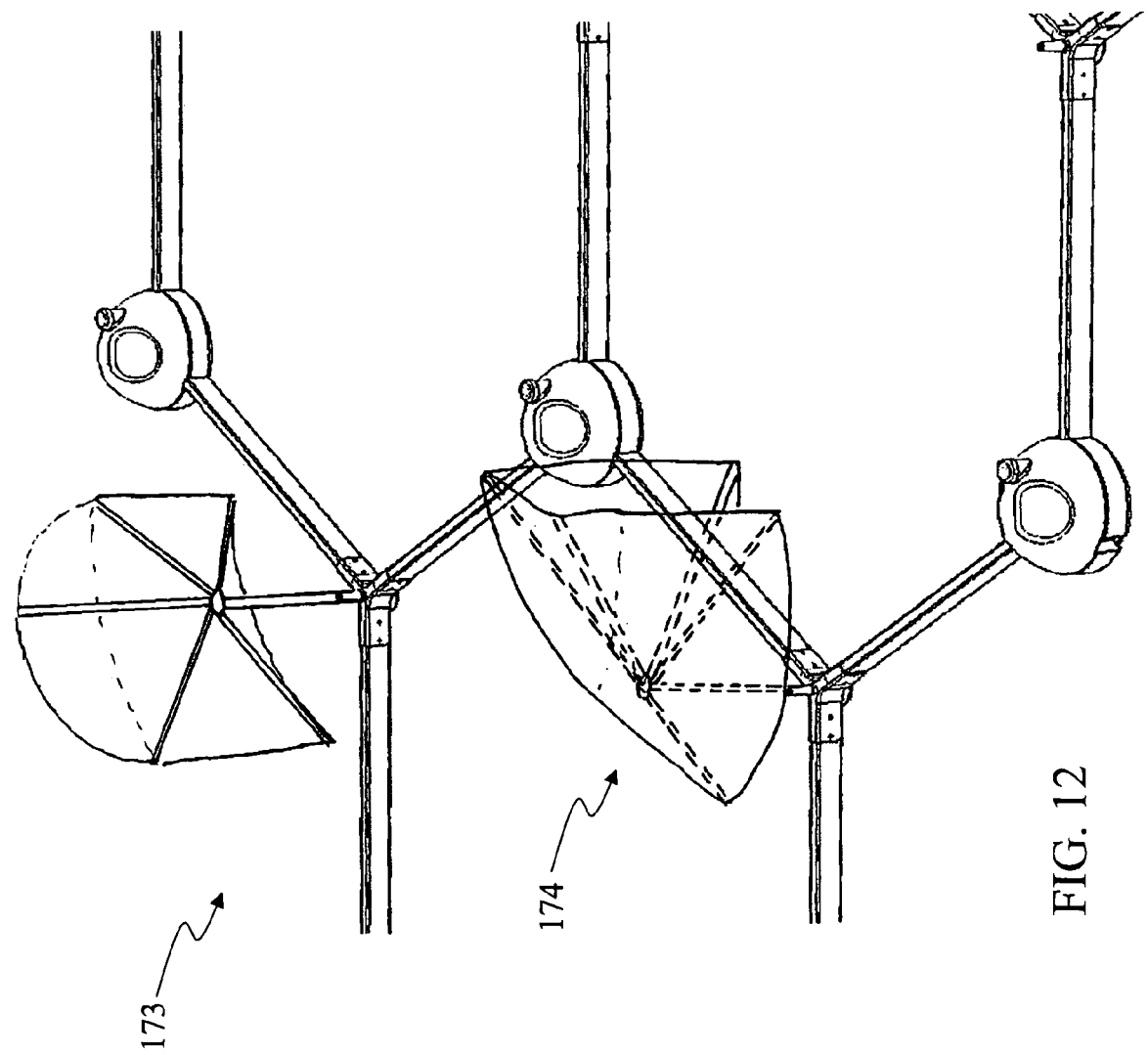
FIG. 12 is a perspective view of the base assemblies of FIG. 8, wherein exemplary wind shields are mounted to the array.

The system of solar collector support structures described herein optionally may receive one or more wind deflectors, such as an integral wind deflector, to further reduce the magnitude of aerodynamic drag and lift forces generated in high wind conditions where the wind deflectors may deflect wind over the deployed receiver arm of a deployed tracking or mast-mounted solar collector. A schematic configuration of exemplary wind deflectors 171–174 is provided in FIGS. 11 and 12. The wind deflector can be mounted to the legs 110, the peripheral junction element 116, the center junction element 112, or another appropriate mounting location. There may be an equal number of wind deflectors and solar collectors, or another ratio of wind deflectors to solar collectors can be used, such as one wind deflector for every three mast mounted or tracking solar collectors.

The wind deflectors advantageously reduce the amount of aerodynamic drag force to which the solar collector 100 is subjected, and causes the wind to apply a downward force to the underlying base assembly 105, thereby assisting in the stabilization of the base assembly on the rooftop. In some embodiments, the wind deflectors shield only the top portions of a tracking or mast-mounted solar collector, such as the top third or half of the solar collector, thereby deflecting wind over the part of the collector capable of generating the greatest aerodynamic lift and drag forces.

Mast-Mounted Solar Collector

Figure 13:
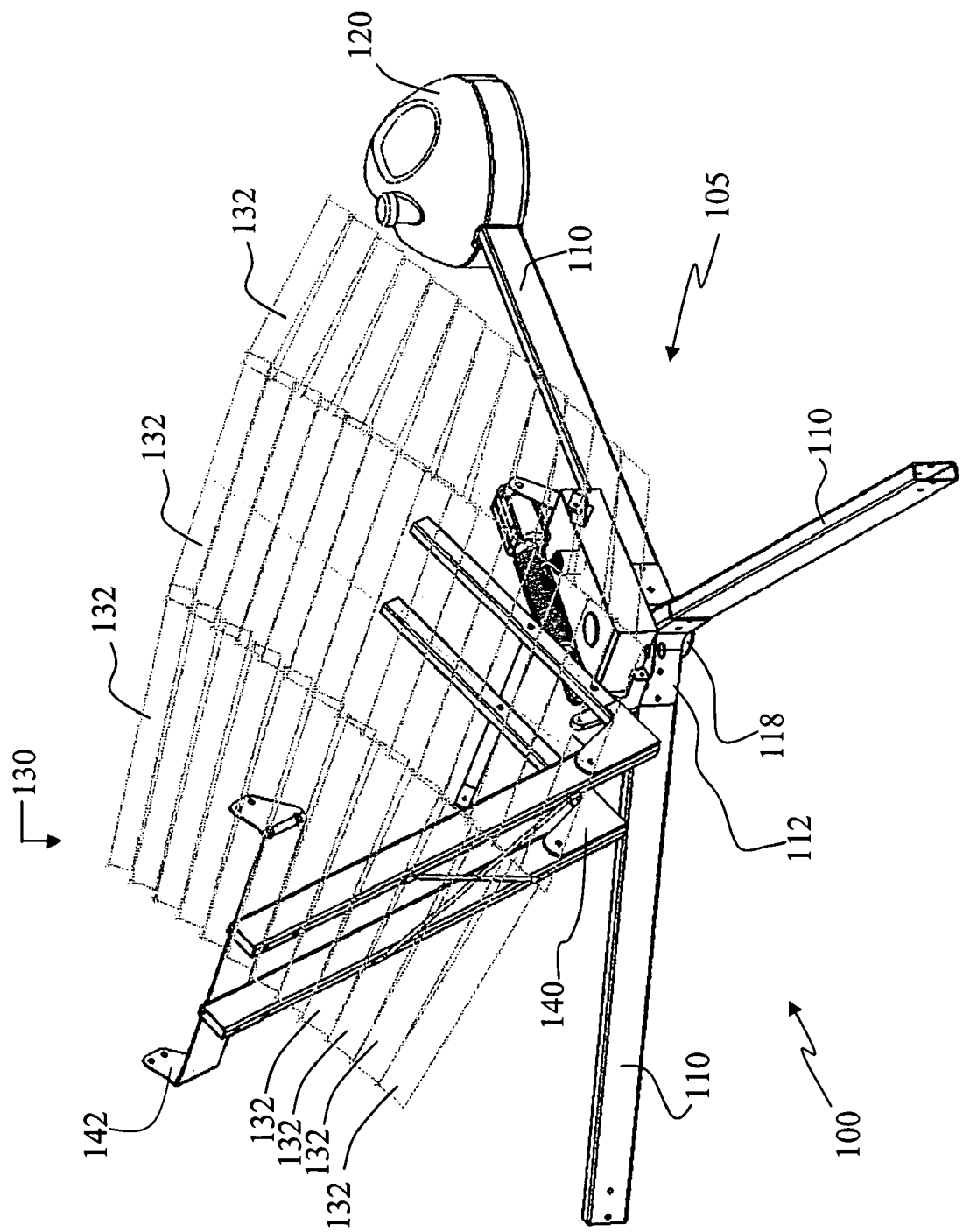
FIG. 13 is a perspective view of an exemplary embodiment of a low profile solar collector in a deployed configuration mounted to an exemplary base assembly.

FIG. 13 is a perspective view of an exemplary embodiment of a low profile tracking solar collector 100 in a deployed configuration. The solar collector 100 is supported by a base assembly 105, which in the illustrated embodiment includes, among other components, three legs 110. A solar collector 100 can be mounted to one or more of the central junction elements 112. The base assembly 105 can include other quantities of legs in other embodiments. A ballast tank 120 is optionally positioned over the end of one or more of the legs 110. Supplemental weight, such as can be provided by materials such as sand, water or lead shot, can be added to the ballast tank 120 to provide a precise amount of weight to aid in the stabilization of the base assembly 105. Other types of ballasts can be used as well. For example, the base can include a tray or holder for paving stones which will provide ballast.

Figure 14:
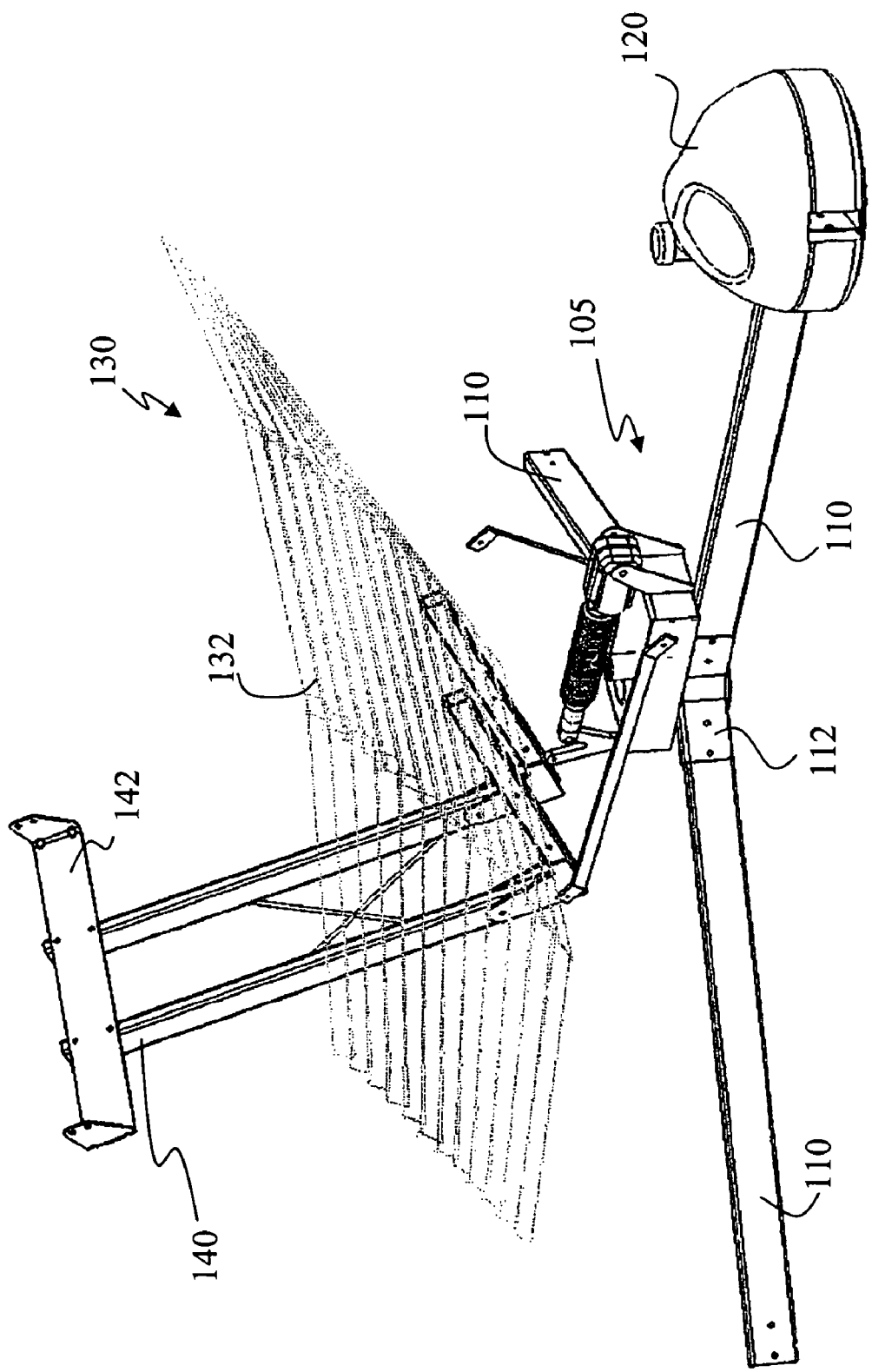
FIG. 14 is another perspective view of the solar collector of FIG. 13.

The solar collector 100 includes a collection surface 130 that comprises an array of optical elements 132. In an exemplary embodiment, the optical elements 132 are mirrors. In other embodiments, the optical elements 132 are lenses or other simple or complex optical elements capable of redirecting light and can include composites of reflective and refractive elements. The solar collector 100 also includes a receiver arm 140 having a mounting bracket 142, to which a collection cell (not illustrated) can be mounted. FIG. 14 is another perspective view of the solar collector 100 of FIG. 13.

Figure 15:
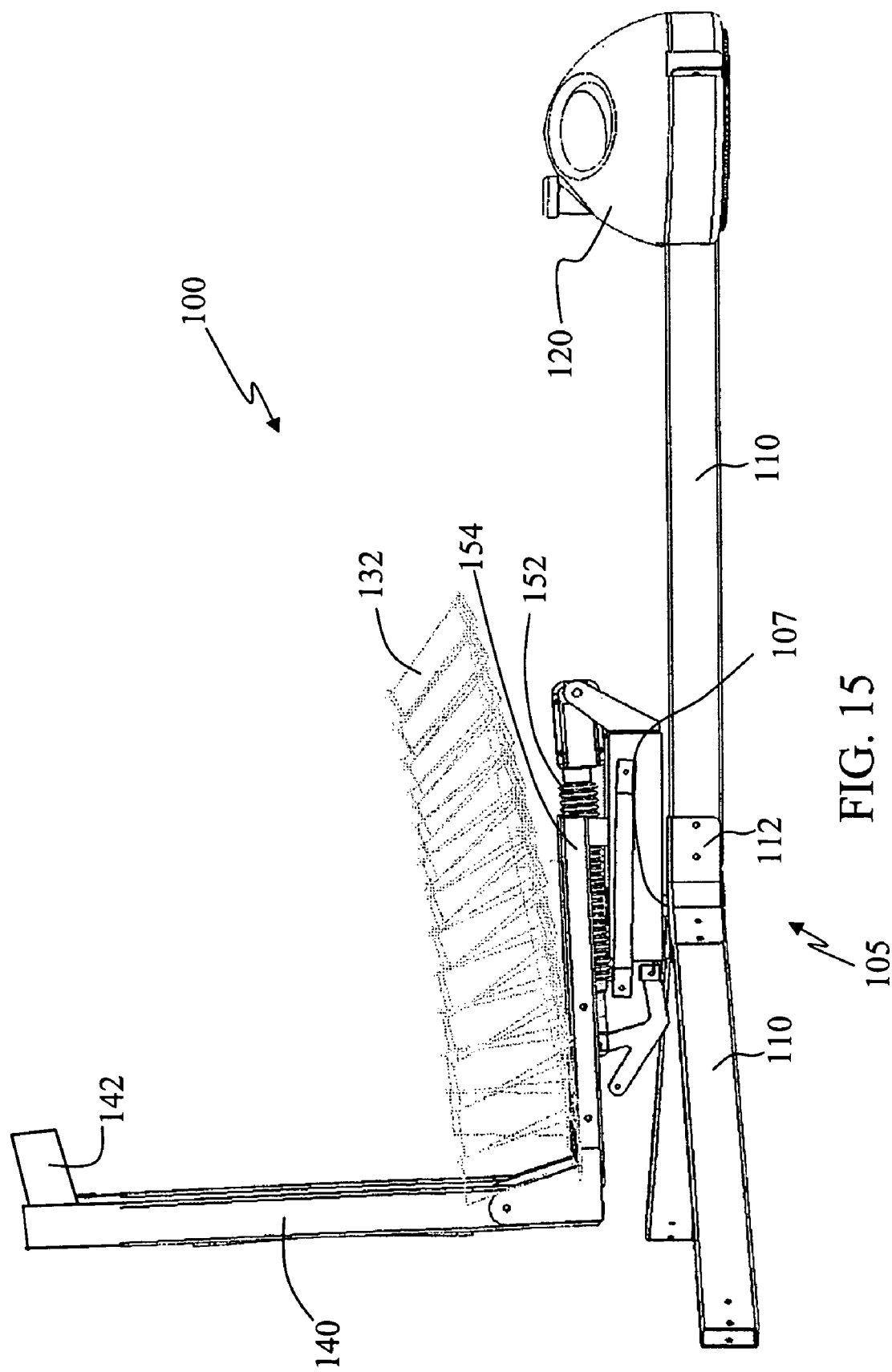
FIG. 15 is a side view of a solar collector mounted to the base assembly of FIGS. 13 and 14, wherein the solar collector is in a stowed configuration.

As illustrated in FIGS. 14 and 15, in this example embodiment, the solar collector 100 protrudes upward from the underlying surface only to a relatively small extent, thereby preventing the generation of tremendous aerodynamic drag and lift forces, even in high wind conditions. Additionally, the optical elements 132 are deployed in a relatively flattened array, thereby providing a significantly lower wind profile, and thereby significantly lower wind resistance, as compared to a conventional reflective dish.

FIG. 15 is a side view of a solar collector 100 mounted to a base assembly 105, wherein the solar collector 100 is in a stowed configuration. As illustrated, the exemplary solar collector 100 is moved between the stowed and deployed configurations by raising and lowering the receiver arm 140. The solar collector 100 can be put in the deployed configuration in high wind conditions, and during storage or transportation. In an exemplary embodiment, an anemometer detects wind speed and automatically stows the solar collector when wind speeds exceed a preset velocity.

Figure 16A:
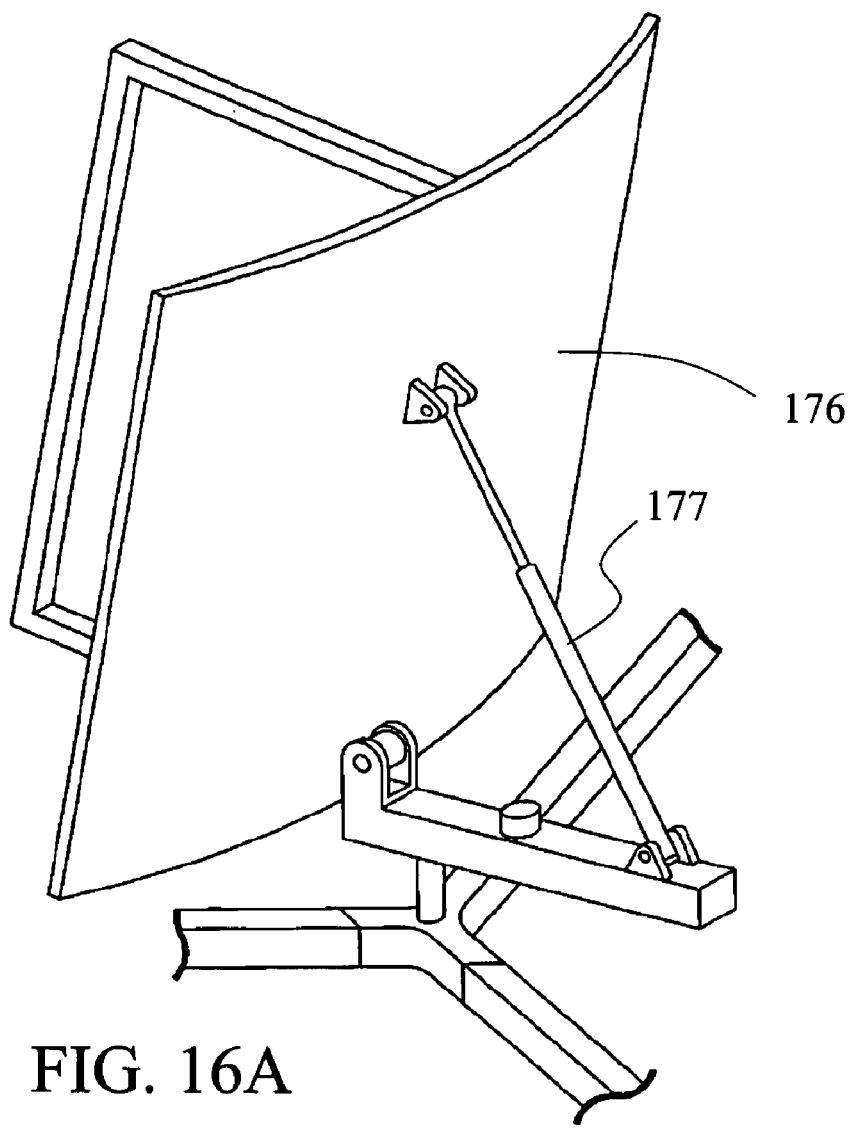
FIG. 16A is a perspective view of another solar collector embodiment and its actuation.
Figure 16B:
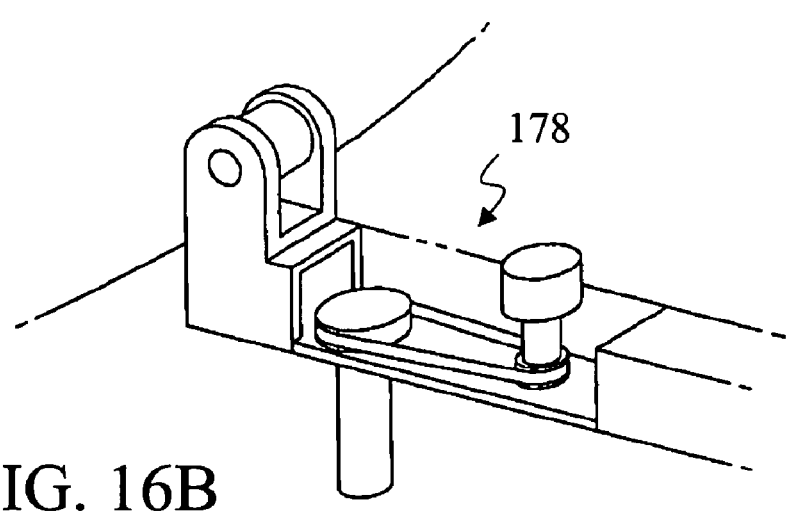
FIG. 16B is a perspective view of another solar collector embodiment and its actuation.
Figure 17:
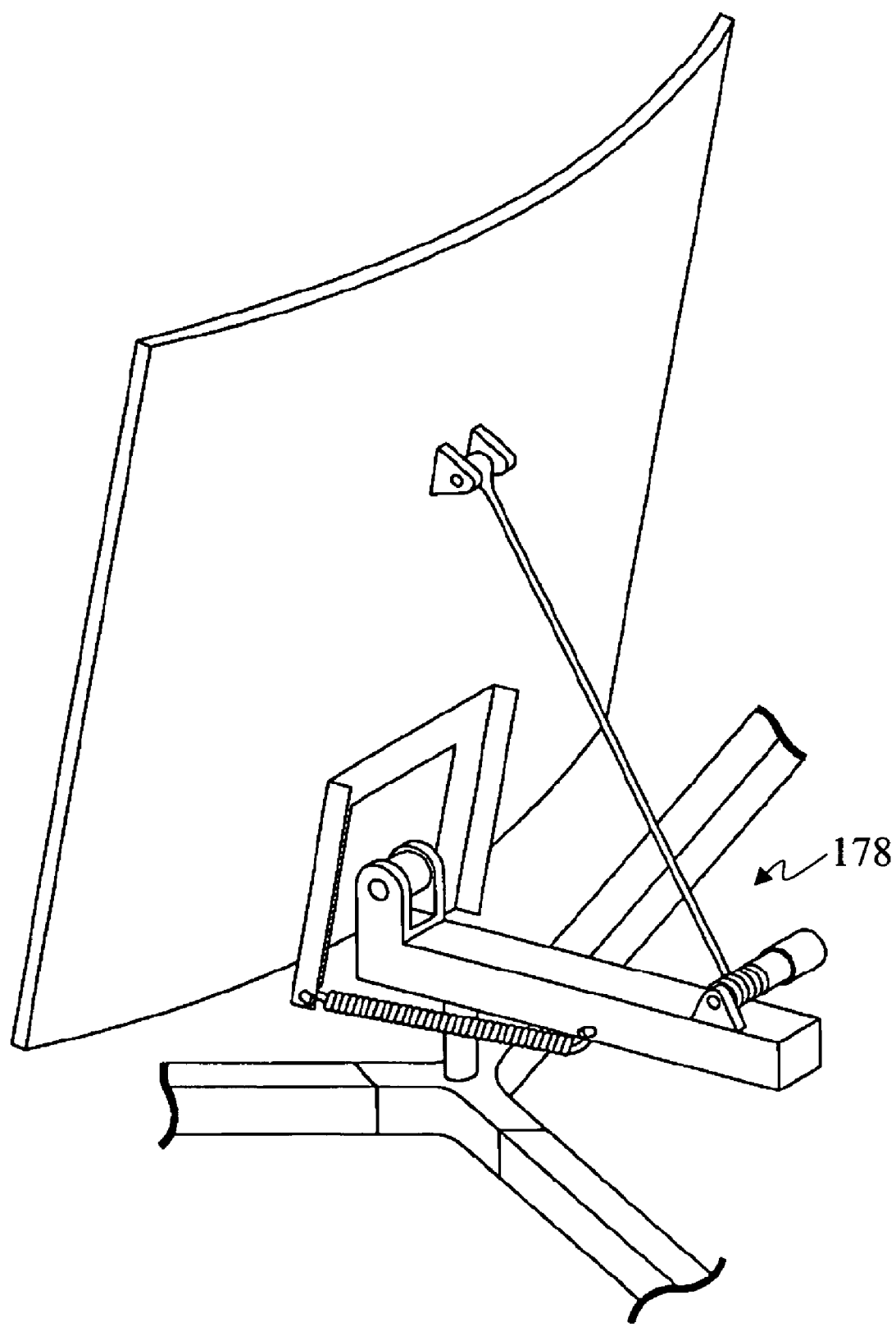
FIG. 17 is a perspective view of another solar collector embodiment and its actuation.
Figure 18:
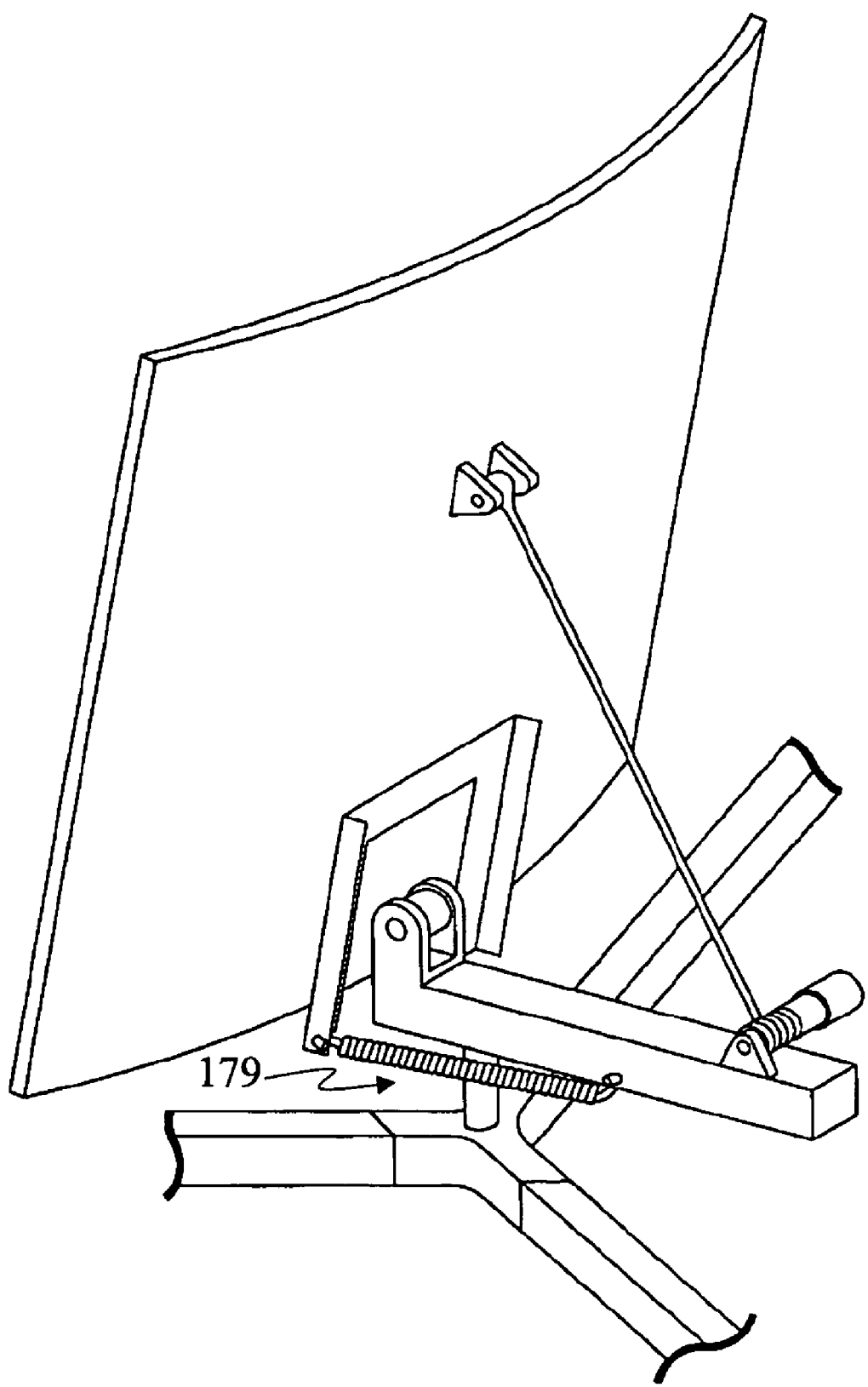
FIG. 18 is a perspective view of another solar collector embodiment and its actuation.

The orientation of the collection surface of an exemplary solar collector may be adjusted in both a horizontal plane (an "azimuth adjustment") and the vertical plane (an "elevation adjustment"). In an exemplary embodiment, an azimuth actuator 150 provides the azimuth adjustment, and an elevation actuator 152 provides the elevation adjustment. The azimuth actuator 150 may include electrical motor with gearing and a belt or chain drive to rotate the solar collector 100 with respect to the post or supporting member 107 of the base assembly. For example, the azimuth actuator 150 may orient the solar collector toward the east in the morning, and toward the west in the afternoon. The elevation actuator 152, illustrated by example as an electrically drive worm screw engaging a pin or tooth fixed attached to a slidable frame of a mast-mounted solar collector, is accordingly configured to pivot the solar collector 100 with respect to the base assembly. That is, an exemplary embodiment may include an elevation actuator 152 includes a motor 151 configured to rotate a screw that causes a bracket 154 supporting the collection surface 130 to be raised or lowered. Other configurations for the azimuth actuator 150 and the elevation actuator can be used in other embodiments. For example, the elevation actuator 152 may orient the solar collector toward the horizon during the early and late portion of the day, and toward the zenith during the midday and effect a stowed position for wing profile minimization. Other effecting and actuating devices may be applied in place of or in combination with a stepper motor. For example, hydraulic, electromagnetic, electromechanical devices such as solenoids and the like may be used FIGS. 16A and 16B illustrate an exemplary continuous reflector surface 176 mast-mounted solar collector having a linear actuator 177 for adjusting elevation and a belt drive or gear box reduction actuator 178 for adjusting azimuth. FIG. 17 illustrates an exemplary continuous reflector surface mast-mounted solar collector where the elevation adjusting linear actuator illustrated in FIG. 16A has been replaced with a motor driven capstan reeling a cable attached to a spring-loaded reflector surface. FIG. 18 illustrates an exemplary continuous reflector surface mast-mounted solar collector where the azimuth adjusting belt drive actuator illustrated in FIG. 17 has been has been augmented in opposing torsional force by a spring-loaded collector frame 179.

Electrical wiring used for collecting electricity from collection cells, for powering and controlling the azimuth and elevation actuators, and for other uses can be routed through the legs 110, which can thereby serve as electrical conduits. The electrical wiring can be coupled to pins or sockets which mate to corresponding sockets or pins in an adjacent solar collector. Other wiring and connection techniques can be used as well.

The system of solar collector support structures disclosed herein by example may support other solar energy collection systems. For example, while the individual optical elements 132 described above are fixed with respect to each other, in other embodiments other systems having individually adjustable tracking elements may be mounted at one or more junction elements to the solar collector support structures.

Heliostat

Figure 19:
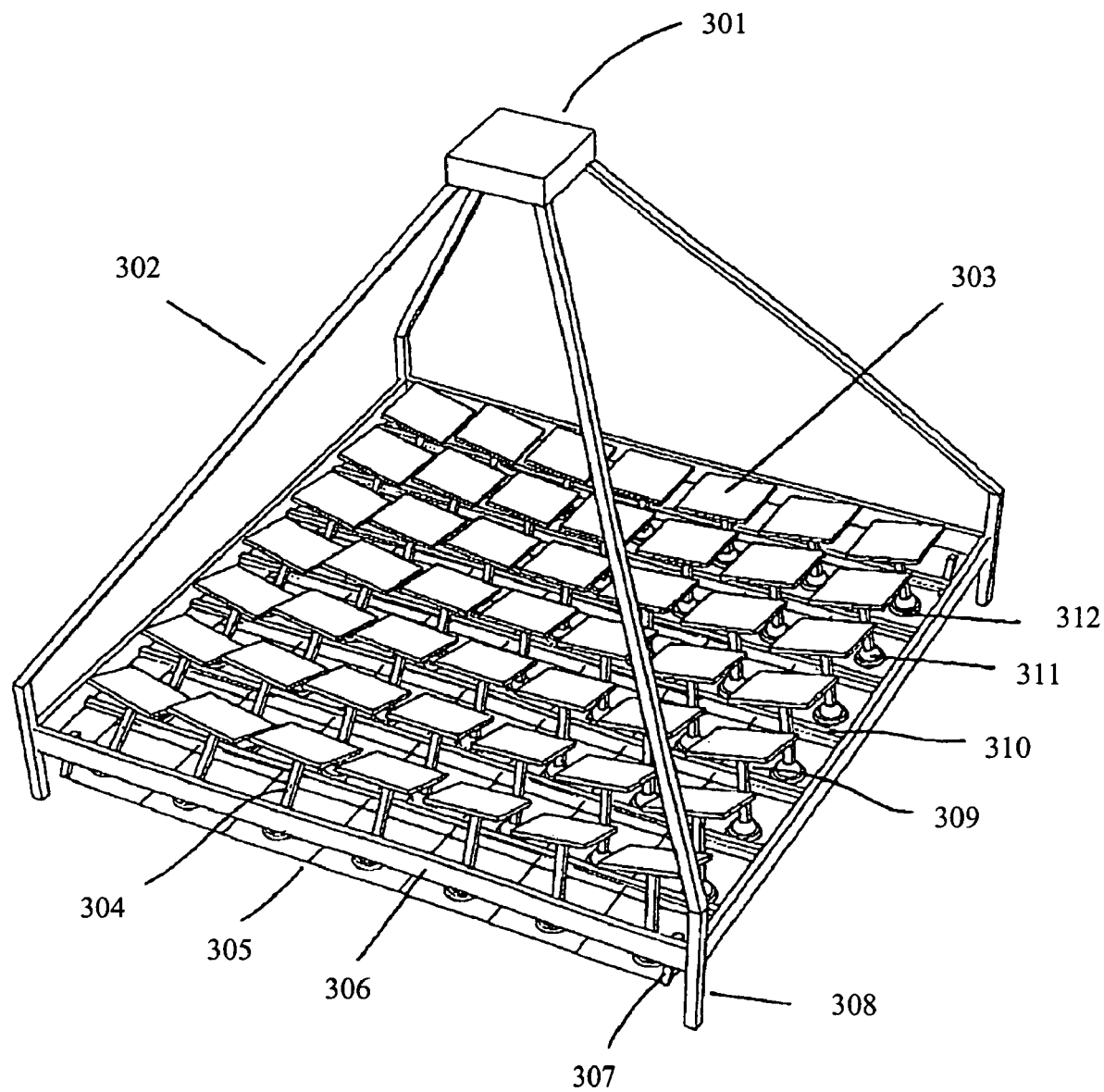
FIG. 19 is a perspective illustration of a heliostat that uses parallel motion of a rigid plate to position the mirrors simultaneously using simple parallel translation, in accordance with the preferred embodiment.

A solar collector having more than one point of attachment to a system of solar collector support structures is illustrated in FIG. 19 as a solar concentrator or concentrator module in the form of a heliostat array comprising a plurality of reflectors and a positioning plate for simultaneously orienting the plurality of reflectors. The positioning plate is adapted to aim or otherwise orient each of the plurality of reflectors in a direction bisecting the interior angle between the source of the radiation and the receiver of the reflected radiation, thereby mapping between the parallel rays associated with a distant object and focused rays associated with the focus. In accordance with the preferred embodiment of the present invention, the positioning plate is a rigid plate with a contoured surface adapted to simultaneously orient each of the plurality of reflections while changing the direction of the parallel rays, i.e., their angles of incident, where the distant object is moving, for example. One skilled in the art will appreciate that the preferred embodiment of the present invention may be used to transmit radiation from a source to a distant object or to collect radiation from a distant object then direct to a common focal point. One skilled in the art will appreciate that the array may be adapted to reflect radiation from a wide portion of the electromagnetic spectrum.

In the preferred embodiment, the array is a linked heliostat array comprising a plurality of siderostats, a positioning plate operatively coupled to each of the plurality of siderostats, and a receiver incorporated into the receiver housing 301. The plurality of siderostats in cooperation with the positioning plate 305, are adapted to reflect the incident sunlight to a common focal point coinciding with a receiver (not shown) independently of the position of the sun. Each of the plurality of siderostats includes a combination reflector and a positioning arm rotatably attached to a heliostat chassis by means of an articulated mounting structure permitting the reflector to be steered under the control of the actuated positioning plate. The positioning plate 305 is generally characterized by a non-planar surface configured to orient each of the reflectors to reflect the sunlight to the same fixed focal point as the sun sweeps across the diurnal sky, for example. The positioning plate 305 is effectively geometrically encoded with the position of each reflector as a function of the receiver position and position of the reflector within the array.

In the exemplary embodiment, the reflectors are mirrors 303 that reflect incident sunlight to the receiver housing 301 and the receiver therein. The position of the receiver and housing 301 are preferably fixed relative to the plurality of siderostats by means of receiver support arms 302. The receiver in the preferred embodiment includes a photovoltaic plate, associated electronics, and cooling system, although various other forms of energy converters may also be employed including thermal absorbing liquids, for example. In alternative embodiments, the receiver is selected from a group comprising a heat exchanger, heat engine, and turbine, for example.

The plurality of mirrors in the exemplary embodiment are arrayed two dimensionally in a horizontal or incline plane and the mirrors adapted to rotated about two orthogonal axes. In other embodiments, the plurality of mirrors may be arrayed three dimensionally with suitable modification to the contour of the positioning plate 305. In the preferred embodiment, each of the siderostats is rotatably affixed to heliostat chassis which comprises a support frame 306, a plurality of supports 310 spanning the width of the chassis, and a plurality of stantions 309 atop the supports 310 for mounting the mirrors 303.

Figure 20:
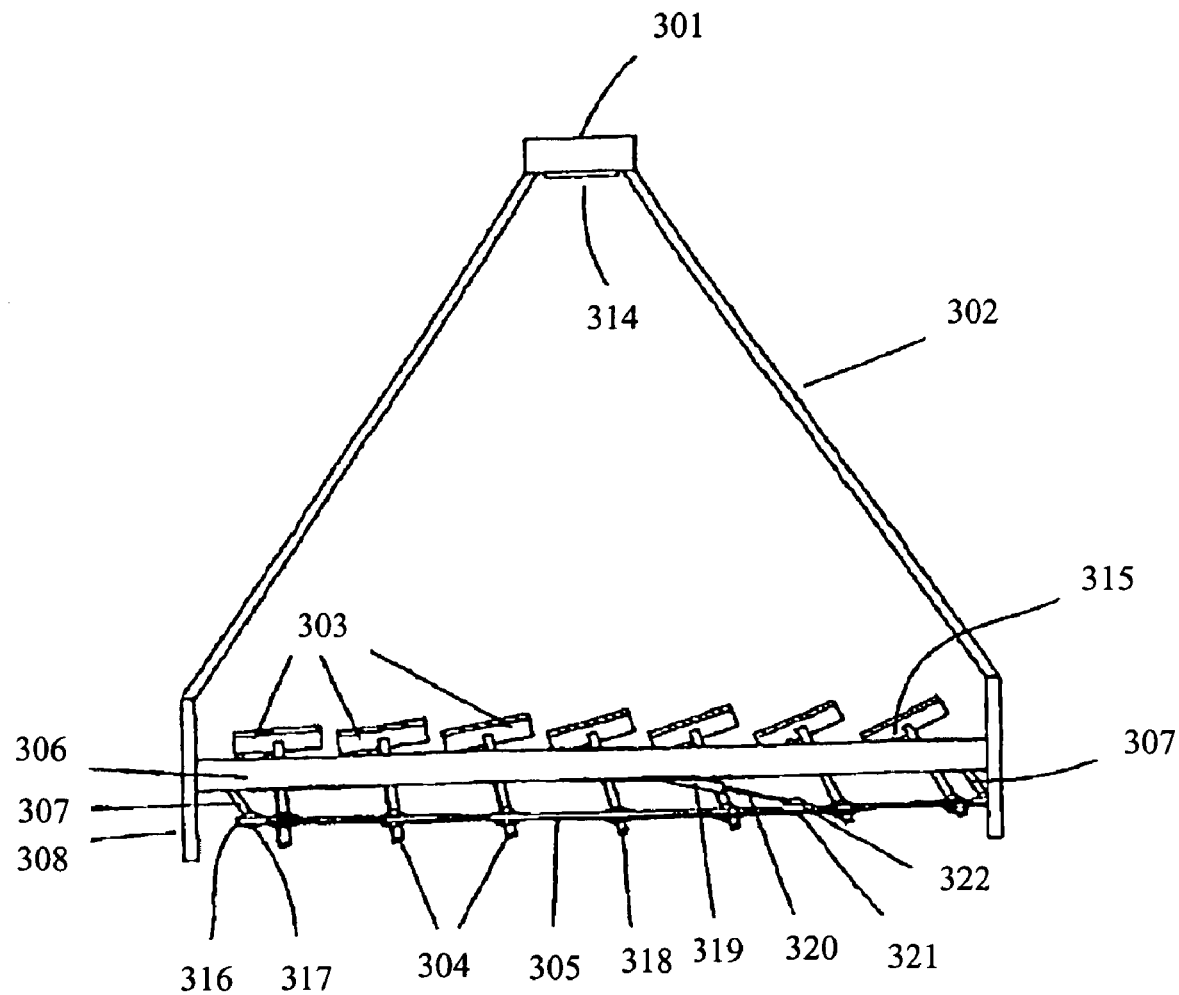
FIG. 20 is a side view of the heliostat, in accordance with the preferred embodiment.

Illustrated in FIG. 20 is a side view of the heliostat array. Each of the plurality of mirrors is oriented so as to bisect the interior angle between an incident ray I and reflected ray R directed to receiver 314. To account for diurnal movement of the source as well as seasonal changes in the declination of the sun, the heliostat is adapted to continuously track movement of the source and alter the position of the positioning plate 305 accordingly. The positioning plate 305 is positioned using at least one, preferably two, actuators that drive the positioning plate 305 to swing relative to the chassis about one, preferably two, orthogonal axes. Each of the one or more actuators (not shown), which may include a servo or stepper motor, for example, are operably coupled to the positioning plate 305 by means of a frame actuator arm 319, a positioning plate actuator arm 320, and an articulated joint including joint ball 321 and ball socket 322.

In some preferred embodiments, the frame of the solar energy concentrator is made to frictionally adhere to a roof using a plurality of footings that distribute the weight of the concentrator and increase the friction inhibiting the concentrator from sliding across the roof under the force of gravity or wind loading or combinations thereof. As illustrated in FIGS. 21A–21C, the heliostat chassis includes a plurality of frame support feet 308, each foot 308 being detachably affixed to a footing that directly engages the roof. In a first embodiment of the footing, the footing includes a hollow container 1100 adapted to receive ballast and means to detachably engage the container 1100 to the leg 308. The hollow footing includes a bayonet fitting or threaded mouth 1104 and cap 1105, for example, adapted to receive ballast 1120—preferably water, sand, or gravel—retained within a reservoir therein. As illustrated in the cross section of the hollow footing in FIG. 21 C, the means to detachably engage the leg 308 includes a post 1102 fixedly attached to the container 1100. The smaller-diameter post 1102 slidably engages the larger-diameter leg 308 until pins 1108A, 1108B outwardly biased by spring 1109 engage corresponding holes 1110 in the leg 308. To detach the footing, the user merely applies pressure to the two pins 1108A, 1108B while lifting the chassis. The footing may also be moved conveniently using the handle 1112 embedded in the container 1100 before of after emptying its contents.

In some embodiments, the walls 1130 of the footings outer facing surfaces are inclined to mitigate the force of wind or to induce downward pressure on the footings for purposes of increasing static friction while spreading the point loads into a larger surface, thus preventing roof damage or deformation. In still other embodiments, the footing includes a rubber pad or other material with a high coefficient of static friction to further enhance the ability of the concentrator to resist lateral movement. In still other embodiments, the footing may be indirectly attached to the roof by means of an adhesive, epoxy, mastic, tar, or like bonding agent. Depending on the weight of the concentrator, the underside of the footings may be designed with a footprint large enough to reduce the overall average roof loading to less than 4 pounds per square foot and the point loading associated with the footing to less than 34 pounds per square foot.

Figure 22B:
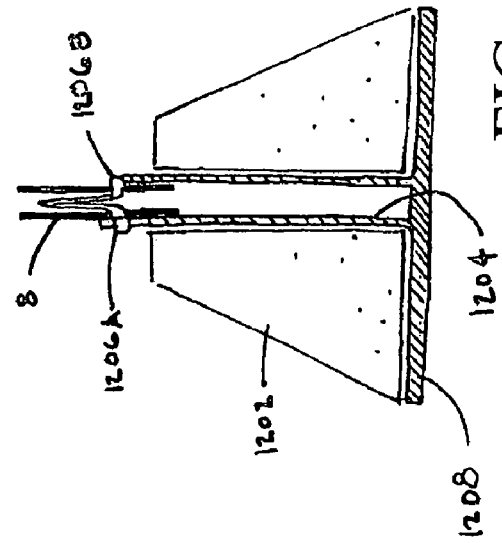
FIGS. 22A–22B are perspective views of a footing for frictionally affixing the heliostat to a roof, in accordance with a second embodiment of the footing.
Figure 22A:
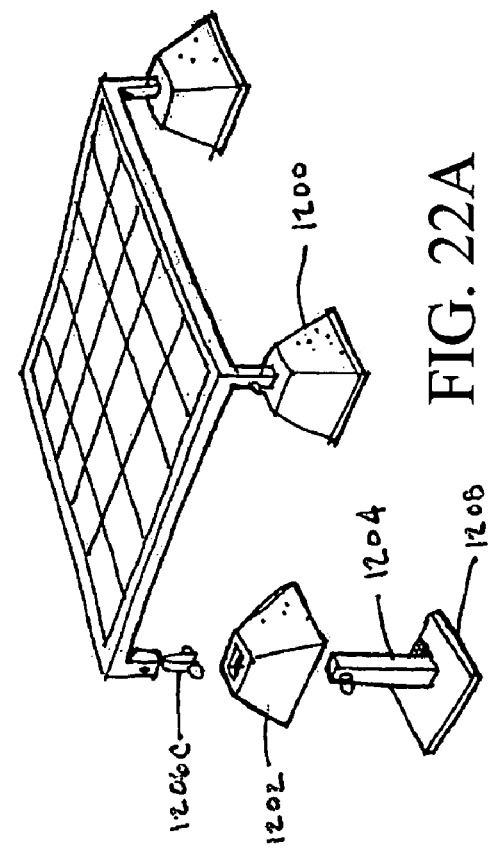

As illustrated in FIGS. 22A and 22B, a second embodiment of a concentrator footing includes a subassembly as a means to detachably engage the leg 308 and solid ballast. The exemplary subassembly includes a post 1204 that slidably engages the leg and a bottom plate 1208 for bearing the weight of the sold ballast 1202. As described above, the post detachably engages heliostat leg 308 by means of pins 1206A, 1206B outwardly biased by a spring 1206C. The ballast may be concrete although various other materials, preferably durable and having a relatively high density may also be employed.

Figure 23B:
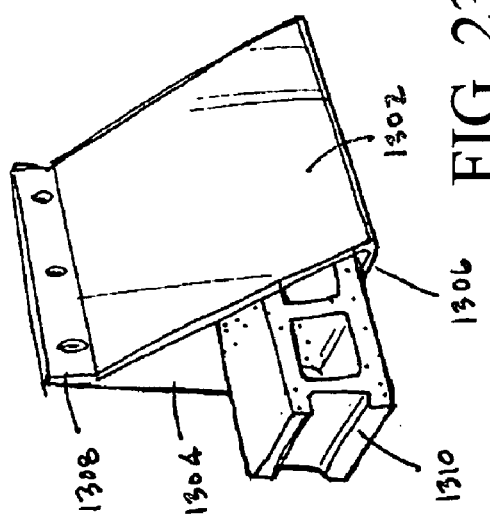
FIG. 23B is a cross sectional view of a footing for frictionally affixing the heliostat to a roof, in accordance with the third embodiment of the footing.
Figure 23A:
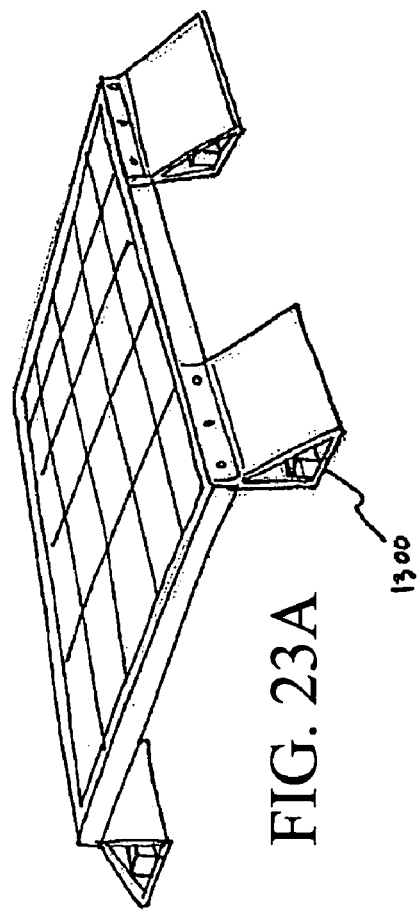
FIG. 23A is perspective view of a footing for frictionally affixing the heliostat to a roof, in accordance with a third embodiment of the footing.

Illustrated in FIGS. 23A and 23B is a third embodiment of a concentrator footing. Each of the one or more footings 1300 is a receptacle including a cavity adapted to receive ballast such as an 8 inch cinder block 1310, for example. The footings 1300 are attached to the concentrator by means of fasteners, e.g., bolts, that engage the mounting plate 1308 Movement of the concentrator is inhibited by the cinder block which enhanced the weight and static friction of the via the inner wall 1304 and bottom plate 1306 made of rigid material. Preferably, the outer wall 1302 is inclined to mitigate the force of wind or to induce downward pressure on the footings for purposes of increasing static friction with the underlying roof.

In addition, the several embodiments of the system of solar collector support structures may be used to secure the heliostat to a mounting surface. For example, junction elements having three or four arms or leg receivers may form three-leg or four-leg base assemblies respectively where these three-leg or four-leg base assemblies may be joined to from hexagonal, square or rectangular arrays of central junction elements for receiving the heliostat footings and peripheral junction elements for receiving ballast elements.

SCOPE OF THE INVENTION

Although the description above contains many specifications, these should not be construed as limiting the scope of the invention but as merely providing illustrations of some of the presently preferred embodiments of this invention. It should be appreciated that the specific configurations and operations disclosed can differ from those described above, and that the systems and methods described herein can be used in contexts other than solar energy collection. Therefore, the invention has been disclosed by way of example and not limitation, and reference should be made to the following claims to determine the scope of the present invention.

What is claimed is:

1. A solar collector support system for mounting a solar collector to a mounting surface, the support system comprising:

a first plurality of leg members, each leg member comprising a proximal end and a distal end; and a first junction element configured to receive: the proximal end of each of the first plurality of leg members; a first footing adapted to engage frictionally the mounting surface; and a first structural support member connected to the solar collector;

wherein the first plurality of leg members are pivotally connected to the first junction element; the plurality of leg members being configured to pivot between:
- a deployed configuration in which the plurality of leg members reside in a common plane at the mounting surface, and
- a stowed configuration in which the plurality of leg members are substantially parallel;

wherein the plurality of leg members in the deployed configuration are configured to hold the solar collector upright;

wherein the support system further comprises a plurality additional junction elements, each of the additional junction elements being configured to receive the distal end of one of said plurality of leg members; and wherein the first junction element and additional junction elements are substantially identical.

2. The solar collector support system of claim 1 wherein the first structural support member is connected to the first footing.

3. The solar collector support system of claim 1 wherein the first structural support member is adapted to support a wind shield.

4. The solar collector support system of claim 1 wherein the distal end of the one of the first plurality of leg members receives a ballast element.

5. The solar collector support system of claim 1 further comprising a second junction element that receives the distal end of one of the first plurality of leg members.

6. The solar collector support system of claim 1 further comprising:
- a ballast element;
- a second plurality of leg members;
- a second footing adapted to engage frictionally the mounting surface;
- a second junction element substantially identical to the first junction element;

wherein the second junction element receives: the distal end of a first leg member of the first plurality of leg members, the ballast element, the second plurality of leg members, and the second footing.

7. The solar collector support system of claim 6 wherein the first leg member is detachably attached to both the first junction element and the second junction element.

8. The solar collector support system of claim 6 wherein the first leg member is rotatably attached to at least one of the first junction element and the second junction element.

9. The solar collector support system of claim 6 wherein the second junction element receives the distal end of the first leg member and is adapted to receive a wind shield structural support member.

10. The solar collector support system of claim 1 wherein one or more of the first plurality of leg members is adapted to house an electrical line.

11. The solar collector support system of claim 1 wherein a distal end of one or more of the first plurality of leg members is adapted to abut a structure extending from the mounting surface.

12. The solar collector support system of claim 1 wherein a distal end of the one or more of the first plurality of leg members is adapted to extend beyond and about a mounting surface boundary.

13. The solar collector support system of claim 1 wherein the first plurality of leg members in the stowed configuration extend outwardly away from a bottom side of the first junction element.

14. The solar collector support system of claim 1 wherein the first plurality of leg members comprise three leg members that extend radially from the first junction element when in the deployed configuration.

15. The solar collector support system of claim 14 wherein the three extended leg members are 120 degrees apart in the deployed configuration.

* * * * *